United States Patent
Hashimoto

(10) Patent No.: US 11,817,679 B2
(45) Date of Patent: *Nov. 14, 2023

(54) LIGHT EMITTING DEVICE

(71) Applicant: NICHIA CORPORATION, Anan (JP)

(72) Inventor: Takuya Hashimoto, Tokushima (JP)

(73) Assignee: NICHIA CORPORATION, Anan (JP)

(*) Notice: Subject to any disclaimer, the term of this patent is extended or adjusted under 35 U.S.C. 154(b) by 0 days.

This patent is subject to a terminal disclaimer.

(21) Appl. No.: 18/162,063

(22) Filed: Jan. 31, 2023

(65) Prior Publication Data

US 2023/0178967 A1 Jun. 8, 2023

Related U.S. Application Data

(63) Continuation of application No. 16/886,170, filed on May 28, 2020, now Pat. No. 11,616,345.

(30) Foreign Application Priority Data

May 29, 2019 (JP) ................. 2019-100467

(51) Int. Cl.
*H01S 5/02253* (2021.01)
*H01S 5/40* (2006.01)
(Continued)

(52) U.S. Cl.
CPC ........ *H01S 5/4025* (2013.01); *H01S 5/02253* (2021.01); *H01S 5/02255* (2021.01);
(Continued)

(58) Field of Classification Search
CPC ............. H01S 5/4025; H01S 5/02253; H01S 5/02255; H01S 5/02345; H01S 5/02469;
(Continued)

(56) References Cited

U.S. PATENT DOCUMENTS 5,875,205 A 2/1999 Spaeth et al.
6,351,443 B1 * 2/2002 Freeman .............. G11B 7/1365
(Continued)

FOREIGN PATENT DOCUMENTS

JP H07-202350 A 8/1995
JP 2000-091693 A 3/2000
(Continued)

OTHER PUBLICATIONS

Final Office Action in U.S. Appl. No. 16/886,170 dated Aug. 30, 2022.
(Continued)

*Primary Examiner* — Xinning(Tom) Niu
(74) *Attorney, Agent, or Firm* — Foley & Lardner LLP

(57) ABSTRACT

A light emitting device includes: a substrate including a main surface; a first projection positioned on the main surface, the first projection including an upper surface and first and second lateral surfaces, wherein the first lateral surface of the first projection comprises a first reflective part, and the second lateral surface of the first projection comprises a second reflective part; a first laser element positioned on the main surface at a first reflective part side with respect to the first projection, the first laser element being configured to irradiate first laser light to the first reflective part; a second laser element positioned on the main surface at a second reflective part side with respect to the first projection, the second laser element being configured to irradiate second laser light to the second reflective part; and a first optical member bonded to the upper surface of the first projection.

13 Claims, 12 Drawing Sheets

(51) Int. Cl.
*H01S 5/024* (2006.01)
*H01S 5/323* (2006.01)
*H01S 5/32* (2006.01)
*H01S 5/02255* (2021.01)
*H01S 5/02345* (2021.01)

(52) U.S. Cl.
CPC ...... *H01S 5/02345* (2021.01); *H01S 5/02469* (2013.01); *H01S 5/323* (2013.01); *H01S 5/3211* (2013.01); *H01S 5/4018* (2013.01)

(58) Field of Classification Search
CPC ...... H01S 5/3211; H01S 5/323; H01S 5/4018; H01S 5/0087; H01S 5/02257; H01S 5/0071; H01S 5/4056; H01S 5/02216; H01S 5/02326

See application file for complete search history.

(56) References Cited

U.S. PATENT DOCUMENTS

| | | | | |
|---|---|---|---|---|
| 11,616,345 B2* | 3/2023 | Hashimoto | ........... | H01S 5/4018 372/50.12 |
| 2005/0169570 A1* | 8/2005 | Kim | ............ | G11B 7/1362 |
| 2008/0013584 A1* | 1/2008 | Freund | ............ | H01S 5/4056 372/50.122 |
| 2016/0087399 A1 | 3/2016 | Horn et al. | | |
| 2016/0341395 A1 | 11/2016 | Kiyota et al. | | |
| 2019/0196207 A1 | 6/2019 | Pierer et al. | | |
| 2021/0180766 A1 | 6/2021 | Kiyota et al. | | |

FOREIGN PATENT DOCUMENTS

| | | |
|---|---|---|
| JP | 2012-094728 A | 5/2012 |
| JP | 2015-228401 A | 12/2015 |
| JP | 2016-219779 A | 12/2016 |
| JP | 2017-098494 A | 6/2017 |

OTHER PUBLICATIONS

Notice of Allowance in U.S. Appl. No. 16/886,170 dated Nov. 17, 2022.

U.S. Office Action in U.S. Appl. No. 16/886,170 dated Feb. 2, 2022.

* cited by examiner

LIGHT EMITTING DEVICE

CROSS-REFERENCE TO RELATED APPLICATION

This application is a continuation of U.S. patent application Ser. No. 16/886,170, filed on May 28, 2020, which claims priority to Japanese Patent Application No. 2019-100467, filed on May 29, 2019. The disclosures of these applications are hereby incorporated by reference in their entireties.

BACKGROUND

The present disclosure relates to a light emitting device.

Various light emitting devices have been provided in which semiconductor laser elements are included as light sources. As an exemplary light emitting device, Japanese Patent Publication No. 2012-94728 discloses a semiconductor laser device. The semiconductor laser device includes a substrate and, on the substrate, a laser element and a mirror including an inclined surface for reflecting laser light. To the upper surface of the mirror, a lens including a lens part is joined. The laser light horizontally emitted from the laser element is vertically reflected by the inclined surface of the mirror, to perpendicularly become incident on the lens part of the lens joined to the upper surface of the mirror.

SUMMARY

There is request for a light emitting device that includes an optical member stably provided with a plurality of laser elements.

According to one embodiment, a light emitting device includes: a substrate including a main surface; a first projection positioned on the main surface, the first projection including an upper surface and first and second lateral surfaces meeting the upper surface, wherein the first lateral surface of the first projection comprises a first reflective part, and the second lateral surface of the first projection comprises a second reflective part; a first laser element positioned on the main surface at a first reflective part side with respect to the first projection, the first laser element being configured to irradiate laser light to the first reflective part; a second laser element positioned on the main surface at a second reflective part side with respect to the first projection, the second laser element being configured to irradiate laser light to the second reflective part; and a first optical member fixed to the upper surface of the first projection, wherein the first optical member comprises a first lens part positioned above the first reflective part, and a second lens part positioned above the second reflective part.

The present disclosure may provide a light emitting device that includes an optical member stably provided with a plurality of laser elements.

DETAILED DESCRIPTION OF EMBODIMENTS

Figure 1A:
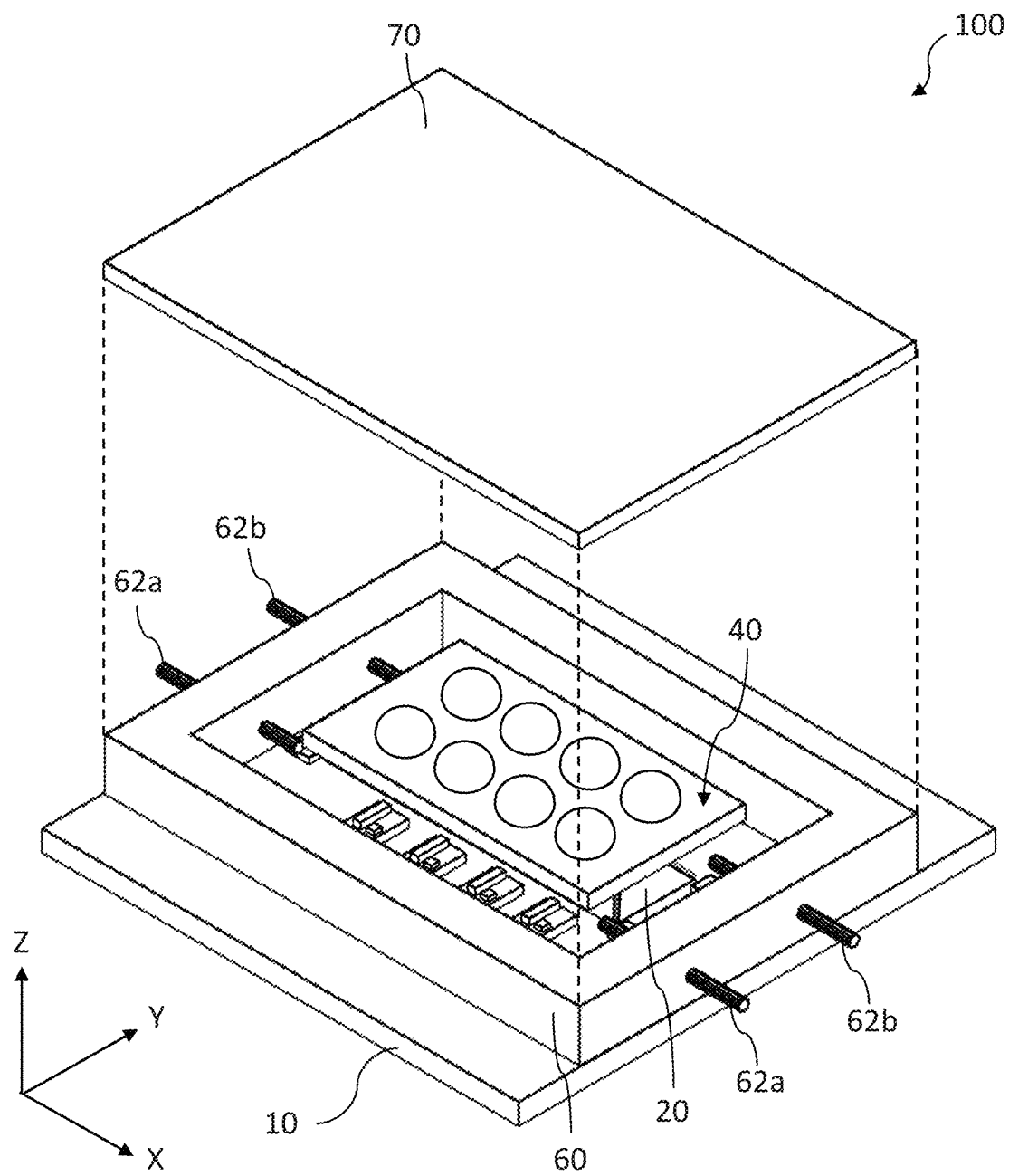
FIG. 1A is a perspective view schematically showing a light emitting device according to an exemplary embodiment of the present disclosure.

In the following, with reference to the drawings, a detailed description will be given of a light emitting device according to embodiments of the present disclosure. Those parts denoted by an identical reference character in a plurality of drawings are an identical or similar part or member.

The following is of an exemplary nature for embodying the technical idea of the present disclosure, and the present disclosure is not limited to the following. The size, material, shape, and relative disposition of the constituent components are not intended to limit the scope of the present disclosure thereto, but to be examples. The size, positional relationship and the like of the members in the drawings may be exaggerated for the sake of easier understanding.

EMBODIMENTS

Figure 1B:
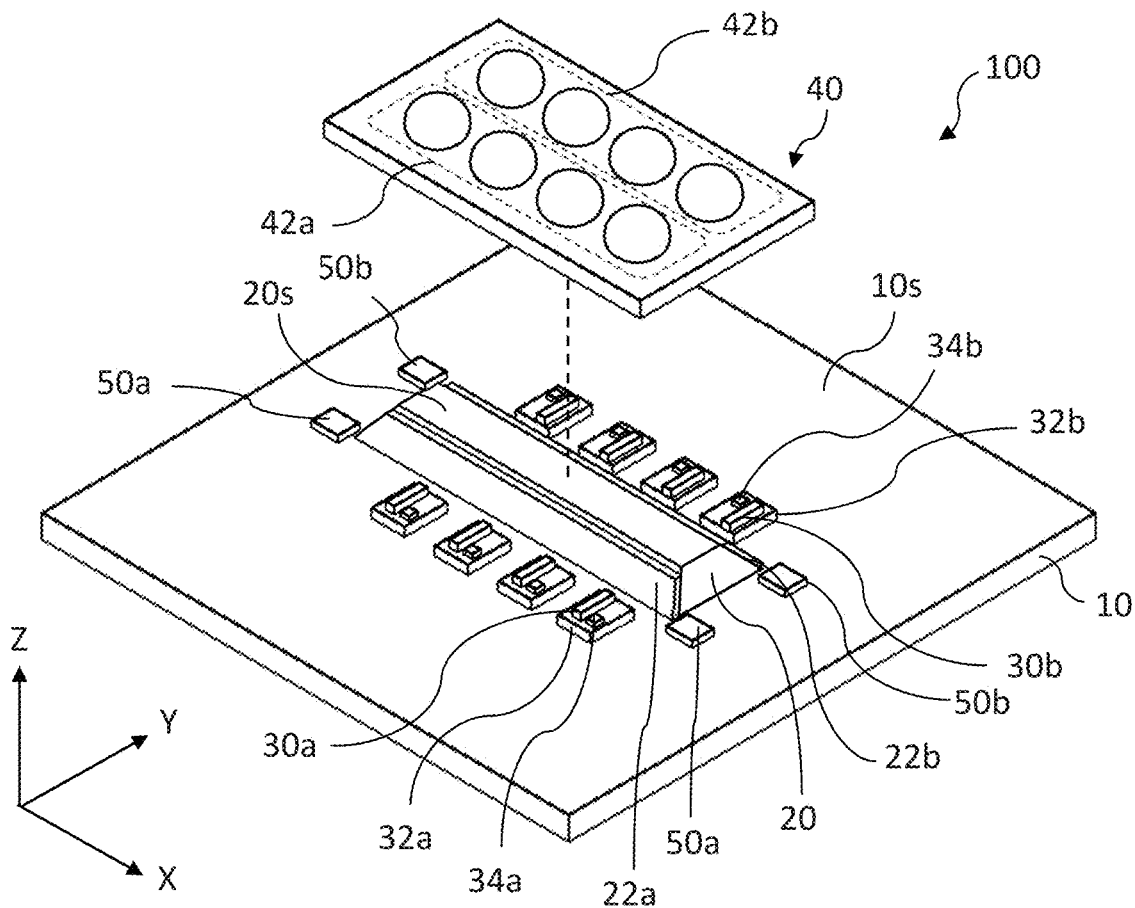
FIG. 1B shows the light emitting device corresponding to FIG. 1A while omitting a frame body and a cover.
Figure 1C:
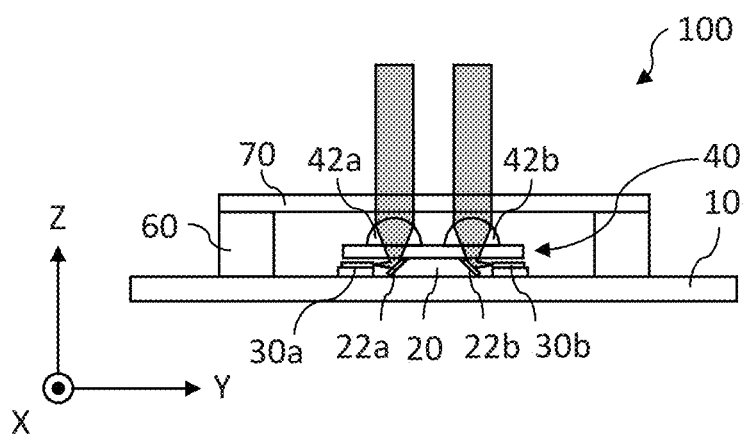
FIG. 1C is a cross-sectional view in the YZ-plane of the light emitting device in FIG. 1A.

FIG. 1A is a perspective view schematically showing a light emitting device 100 according to an exemplary embodiment of the present disclosure. For the sake of convenience, the FIG. 1A shows the light emitting device 100 in a state that a frame body 60 and a cover 70 are separated from each other. The light emitting device 100 shown in FIG. 1A is also a hermetically sealed package. FIG. 1B shows the light emitting device 100 corresponding to FIG. 1A while omitting the frame body 60 and the cover 70. FIG. 1C is a cross-sectional view in the YZ-plane of the light emitting device 100 in FIG. 1A.

Firstly, with reference to FIG. 1B, a description will be given of constituent components of the light emitting device 100 according to the present embodiment. The light emitting device 100 includes a substrate 10, a projection 20, four first laser elements 30a, four second laser elements 30b, and an optical member 40.

While the X-direction, the Y-direction, and the Z-direction perpendicular to one another are shown for the sake of convenience, the orientation of the light emitting device 100 can be appropriately determined. In FIG. 1B, the optical member 40 and the projection 20 are illustrated as being separated from each other for the sake of convenience.

For the sake of clarity, with reference to the substrate 10, the side on which the projection 20, the first laser elements 30a, the second laser elements 30b, and the optical member 40 are positioned is defined as an "upper side". This does not limit the orientation of the light emitting device 100 in use, and the orientation of the light emitting device 100 can be appropriately determined. In the case in which there is only a single projection is provided also, the projection may be referred to as "the first projection". In the case in which there is only a single optical member also, the optical member may be referred to as "the first optical member".

The substrate 10 includes a main surface 10s that is parallel to the XY-plane, and has a thickness in the Z-direction. The projection 20 includes an upper surface 20s, two lateral surfaces that are parallel to the X-direction and meet the upper surface 20s, and two lateral surfaces that are parallel to the Y-direction and meet the upper surface 20s. The upper surface 20s of the projection 20 is typically parallel to the main surface 10s.

In FIG. 1B, the projection 20 has a ridge shape extending in the X-direction, which is the longitudinal direction of the main surface 10s. The two lateral surfaces (first and second lateral surfaces) parallel to the X-direction are oriented upward. That is, the direction normal to a lateral surface is in the direction away from the main surface 10s. The direction normal to a lateral surface is a direction perpendicular to the lateral surface, and is the direction away from the projection 20. In the two lateral surfaces parallel to the X-direction, the first lateral surface includes a first reflective part 22a, and the second lateral surface includes a second reflective part 22b. The two lateral surfaces parallel to the Y-direction may be oriented upward or not.

The first laser elements 30a and the second laser elements 30b are respectively positioned on the first reflective part 22a side and the second reflective part 22b side with reference to the projection 20 on the main surface 10s. While detailed description will be given later, the first laser elements 30a and the second laser elements 30b are semiconductor laser elements (e.g., laser diodes).

In FIG. 1B, the plurality of first laser elements 30a and the plurality of second laser elements 30b are arranged in the longitudinal direction of the projection 20. In other words, the plurality of first laser elements 30a is arranged along one of the two lateral surfaces parallel to the X-direction, and the plurality of second laser elements 30b is arranged along other one of the two lateral surfaces parallel to the X-direction.

A first gap between any first laser element 30a and the first reflective part 22a is constant over the plurality of first laser elements 30a. A second gap between any second laser element 30b and the second reflective part 22b is constant over the plurality of second laser elements 30b. The first gap and the second gap are equal to each other. Note that, "being constant or equal as" used herein permits a tolerance of 20 µm or less. The first gap may not necessary be constant. The same holds true to the second gap, or to the relationship between the first gap and the second gap.

The first laser elements 30a and the second laser elements 30b respectively emit laser light toward the first reflective part 22a and the second reflective part 22b. In this manner, the first laser elements 30a and the second laser elements 30b have their respective laser-light emission end surfaces facing each other as being oriented inward in the light emitting device 100. The first reflective part 22a and the second reflective part 22b respectively reflect laser light emitted from the first laser elements 30a and the second laser elements 30b.

The angle formed between the first reflective part 22a and the main surface 10s and the angle formed between the second reflective part 22b and the main surface 10s are determined by the direction of the laser light beams emitted from the first laser elements 30a and the second laser element 30b, and the position of the optical member 40. In FIG. 1B, the angles are each 45 degrees. Note that, the angles may have a value other than 45 degrees.

The laser light emitted from the first laser elements 30a in the +Y-direction is reflected by the first reflective part 22a in the +Z-direction. The laser light emitted from the second laser elements 30b in the −Y-direction is reflected by the second reflective part 22b in the +Z-direction. Note that, +directions correspond to the arrow directions in FIG. 1B, and −directions correspond to the direction opposite to the arrows in FIG. 1B.

The optical member 40 is fixed to the upper surface 20s of the projection 20. The optical member 40 includes a first lens part 42a positioned above the first reflective part 22a, and a second lens part 42b positioned above the second reflective part 22b. The region where the lower surface of the optical member 40 and the upper surface 20s of the projection 20 are in contact with each other may be, for example, parallel to the XY-plane and flat.

The first lens part 42a is positioned so that laser light emitted from the first laser elements 30a and reflected by the first reflective part 22a passes through the first lens part 42a. Similarly, the second lens part 42b is positioned so that laser light emitted from the second laser element 30b and reflected by the second reflective part 22b passes through the second lens part 22b.

In the case in which the first laser element 30a is one in number, the first lens part 42a includes one lens. In the case in which the first laser elements 30a are two or more in number, the first lens part 42a is a lens array that includes lenses respectively corresponding to the plurality of first laser elements 30a. Similarly, in the case in which the second laser element 30b is one in number, the second lens part 42b includes one lens. In the case in which the second laser elements 30b are two or more in number, the second lens part 42b is a lens array that includes lenses respectively corresponding to the plurality of second laser elements 30b. The optical member 40 may include a lens part other than the first lens part 42a and the second lens part 42b.

As shown in FIGS. 1A and 1B, the first lens part 42a and the second lens part 42b are positioned on upper surface side of the optical member 40. By the first lens part 42a and the second lens part 42b being positioned on the upper surface side of the optical member 40 but not on its lower surface side, the height of the projection 20 can be small. The projection 20 forms the first reflective part 22a and the second reflective part 22b. Accordingly, as the projection 20 has a greater height, the area of the upper surface 20s of the projection 20 is smaller. The projection 20 having a smaller height can provide a greater area of the upper surface 20s, and contributes to stably fixing the optical member 40.

By the optical member 40 being provided with the lens at its upper surface side, as seen in a top view, the lenses are provided so as to include the region overlapping with the upper surface 20s of the projection 20. This reduces the distance between the laser light from the first laser elements 30a and the laser light from the second laser elements 30b, to thereby reduce the whole size of light emitted from the light emitting device 100.

The lenses exert optical control on the emission of laser light having become incident on the lower surface of the optical member 40. The manner of the optical control is: collimating the laser light to be collimated light; and allowing the collimated light to be emitted from the upper surface of the optical member 40. Note that, depending on the intended use, the manner of the optical control is not limited to collimating. The lenses may converge or diverge the laser light having become incident on the lower surface of the optical member 40 and allow the collimated light to be emitted from the upper surface of the optical member 40.

In FIG. 1C, the gray regions respectively represent progress of the laser light beams emitted from the first laser elements 30a and the second laser elements 30b. As shown in FIG. 1C, laser light beams emitted from the first laser elements 30a and the second laser elements 30b are respectively reflected upward by the first reflective part 22a and the second reflective part 22b. The laser light beams reflected by the first reflective part 22a and the second reflective part 22b are respectively collimated by the first lens part 42a and the second lens part 42b, transmit through the cover 70 and emitted in the Z-direction.

In the case in which the upper surface 20s of the projection 20 is parallel to the XY-plane and flat, in fixing the optical member 40 to the upper surface 20s of the projection 20, the optical member 40 can be shifted in parallel to the XY-plane along the upper surface 20s of the projection 20. This can eliminate consideration of the inclination of the optical member 40, and facilitate alignment between the first laser elements 30a and the first lens part 42a via the first reflective part 22a, and between the second laser elements 30b and the second lens part 42b via the second reflective part 22b. This may consequently reduce misalignment and inclination of the laser light transmitting through the first lens part 42a and the second lens part 42b. Note that, as will be described later, in the case in which the upper surface 20s of the projection 20 is fixed to the optical member 40 with a bonding member, the upper surface 20s of the projection 20 can be processed to be roughened so as to effectively improve the bonding strength at the bonding surface.

In the light emitting device 100 according to the present embodiment, the optical member 40 is disposed on the upper surface 20s of the projection 20. This can reduce the distance from the first laser elements 30a to the first lens part 42a via the first reflective part 22a, and the distance from the second laser elements 30b to the second lens part 42b via the second reflective part 22b, as compared to the case in which the optical member 40 is disposed above and spaced apart from the projection 20. Note that, an example in which the optical member 40 is disposed above and spaced apart from the projection 20 is, for example, a light emitting device in which other member is interposed between the projection 20 and the optical member 40.

As the distance is shorter, the laser light beams respectively emitted from the first laser elements 30a and the second laser elements 30b reach the first lens part 42a and the second lens part 42b by smaller beam diameters. This allows designing the first lens part 42a and the second lens part 42b in small lens sizes, as compared to the above-described example. Such downsizing of the lenses can realize reducing the interval between two adjacent lenses, and hence reduces the size of the light emitting device 100 also in the X-direction.

In view of further reducing the distance to the first lens part 42a and the second lens part 42b, the first lens part 42a and the second lens part 42b can be provided on the lower surface side of the optical member 40 but not on the upper surface side thereof. This may further reduce the size of the lenses. However, in this case, the first lens part 42a and the second lens part 42b are provided so as to avoid contact with part of the projection 20. For example, the shortest distance between the first lens part 42a and the second lens part 42b in the Y-direction is designed to be longer than the width of the projection 20 in the Y-direction.

The center of the lower surface of the optical member 40 overlaps with the upper surface 20s of the projection 20 as seen in a top view. The center of gravity of the optical member 40 overlaps with the upper surface 20s of the projection 20 as seen in a top view. This can further facilitate the above-described alignment, and allows the optical member 40 to be stably provided on the upper surface 20s of the projection 20.

In the light emitting device 100, the optical member 40 is provided so that the first lens part 42a and the second lens part 42b oppose to each other with reference to the upper surface 20s of the projection 20. Such a shape and positioning allow the optical member 40 to be stably bonded to the projection 20. Note that, the midpoint of the distance between the opposing first lens part 42a and second lens part 42b overlaps with the upper surface 20s of the projection 20 as seen in a top view. In the case in which the opposing first lens part 42a and second lens part 42b are coupled to each other, the coupling point or the coupling plane overlaps with the upper surface 20s of the projection 20 as seen in a top view.

Note that, in the case in which the laser elements are positioned only on one side of the projection 20, that is, in the case in which only one of the first laser elements 30a and the second laser elements 30b is disposed also, the optical member 40 including the first lens part 42a and the second lens part 42b can be disposed on the upper surface 20s of the projection 20 for safety. The laser elements on the opposite sides of the projection 20 may not be identical to each other in number. Accordingly, the number of lenses in the first lens part 42a and the number of lenses in the second lens part 42b of the optical member 40 may not be the same. The optical member 40 may include a lens in addition to the first lens part 42a and the second lens part 42b. In such a case also, in order for the optical member 40 to be fixed to the projection 20 while keeping balance, the optical member 40 is desirably disposed having its center of gravity overlapped with the upper surface 20s of the projection 20 as seen in a top view.

According to the light emitting device of the present disclosure, stable support and fixation of the optical member in the package may be realized. Furthermore, the present disclosure may realize the downsized light emitting device.

In the following, a detailed description will be given of the constituent components of the light emitting device 100 according to the present embodiment and other components.

Substrate 10

The substrate 10 is desirably formed of a material of which thermal conductivity is relatively high, so as to quickly release the heat generated by the plurality of laser elements. The thermal conductivity of the substrate 10 may be, for example, 20 W/mK or more. Such a material may be, for example, metal such as Cu, Al, Fe, Ni, Mo or the like, or ceramic such as AlN, SiC or the like. In order to attain a further higher thermal conductivity, the main surface 10s of the substrate 10 formed of the above-described material may be partially plated with Au, Ag, Al or the like. As an example, the main surface 10s of the substrate 10 formed of copper or copper alloy is gold-plated.

The shape and size of the substrate 10 should be adjusted as appropriate according to the desired shape and size of the light emitting device 100. The substrate 10 has a plane. The substrate 10 may have, for example, one plane shape selected from the group consisting of a quadrangle, a polygon, a circle, an oval, and any shape similar to the foregoing. As an example, the substrate 10 has a quadrangular plane shape having each side adjusted in a range of 5 mm to 50 mm inclusive. The thickness in the Z-direction of the substrate 10 is adjusted in a range of, for example, 0.5 mm to 5.0 mm inclusive. The substrate 10 may be provided with a recess or a projection, at which the first laser elements 30a and the second laser elements 30b may be provided. The substrate 10 may be provided with, at its region outer than the frame body 60, a hole for screwing, or may have a shape for allowing the light emitting device 100 to be fixed as one constituent of other device.

Projection 20

The projection 20 extends in the X-direction. Note that, in the case in which the number of the first laser elements 30a and the second laser elements 30b is small, the projection 20 does not necessarily extend in the X-direction. The projection 20 includes the upper surface 20s, two lateral surfaces that are parallel to the X-direction and meet the upper surface 20s, and two lateral surfaces that are parallel to the Y-direction and meet the upper surface 20s. Note that, the two lateral surfaces are not necessarily both parallel to a particular direction. The surface shape of the lateral surfaces may each be a flat shape of a curved shape. The two lateral surfaces may be identical to or different from each other in surface shape. The projection 20 may be disposed on the main surface 10s, or the projection 20 may be formed on the main surface 10s as part of the substrate 10. In order to facilitate disposing the optical member 40 on the upper surface 20s of the projection 20, the length in the X-direction of the upper surface 20s of the projection 20 preferably is in a range of, for example, 3 mm to 20 mm inclusive, and the width in the Y-direction of the upper surface 20s of the projection 20 preferably is in a range of, for example, 2 mm to 10 mm inclusive. The upper limit value is set taking into consideration of downsizing the light emitting device 100. On the other hand, in order to dispose the optical member 40 at a lower position, the height of the projection 20 in the Z-direction preferably is, for example, 3 mm or less. This may realize downsizing the light emitting device 100.

The first reflective part 22a and the second reflective part 22b in the projection 20 can be formed of, for example, at least one selected from the group consisting of, for example, glass, quartz, synthetic quartz, sapphire, ceramic, plastic, silicon, metal, and a dielectric material. At least one of the first reflective part 22a and the second reflective part 22b can have the function of modifying the intensity of the laser light, or the function of converting the wavelength of the laser light. In order to bond the first reflective part 22a and the second reflective part 22b, the two lateral surfaces can be provided with a thin film formed using a material selected from the group consisting of Ti/Pt/Au, Ti/Ni/Au, Ni/Au, and Ti/Ni/Ag. In place of providing the first reflective part 22a and the second reflective part 22b at the lateral surfaces of the projection 20, the first reflective part 22a and the second reflective part 22b can be realized by forming the projection 20 with a reflective material.

First Laser Elements 30a and Second Laser Elements 30b

The first laser elements 30a and the second laser elements 30b are each four in number, but the number is not limited thereto. The first laser element 30a and the second laser element 30b should each be provided by at least one in number. However, in view of a downsized light emitting device, the number of the first laser elements 30a and the second laser elements 30b can each be, for example, eight or less. The center-to-center distance between any two adjacent laser elements in the plurality of first laser elements 30a, and the center-to-center distance between any two adjacent laser elements in the plurality of second laser elements 30b are each, for example, 0.85 mm or more. This can reduce the influence of heat generated by the laser elements. On the other hand, in view of the downsized light emitting device 100, the center-to-center distance is preferably 2.5 mm or less, for example. Note that, the interval of the plurality of first laser elements 30a and interval of the plurality of second laser elements 30b may not be regular.

As shown in FIG. 1B, the light emitting device 100 further includes first submounts 32a positioned between the first laser elements 30a and the main surface 10s, and second submounts 32b positioned between the second laser elements 30b and the main surface 10s. In other words, the first laser elements 30a are positioned on the main surface 10s via the first submounts 32a, and the second laser elements 30b are positioned on the main surface 10s via the second submounts 32b. Electrode pads 34a for the first laser elements 30a and electrode pads 34b for the second laser elements 30b are respectively positioned on the first submounts 32a and the second submounts 32b, for wirings that will be described later. Note that, the submounts and the electrode pads are not necessarily provided.

Each of the first laser elements 30a is disposed having its lower surface in contact with the upper surface of the corresponding first submount 32a, and each of the second laser element 30b is disposed having its lower surface in contact with the upper surface of the corresponding second submount 32b. This structure can increase the contact area between the first laser element 30a and the first submount 32a and the contact area between the second laser element 30b and the second submount 32b, thereby efficiently releasing heat generated by each laser element to the outside. For this heat dissipation, the first submounts 32a and the second submounts 32b can be formed of a material of which thermal conductivity is high. Examples of such a material includes at least one selected from the group consisting of, for example, AlN, CuW, diamond, SiC, and ceramic. For bonding the first laser elements 30a and the second laser elements 30b, a thin film selected from the group consisting of Ti/Pt/Au and Ni/Au may be formed at the surface of each of the first submounts 32a and the second submounts 32b.

The plurality of first laser elements 30a is respectively positioned on the plurality of first submounts 32a, and the plurality of second laser elements 30b is respectively positioned on the plurality of second submounts 32b. This can facilitate fine adjustment of the position of the plurality of first laser elements 30a and the plurality of second laser elements 30b, and the first reflective part 22a and the second reflective part 22b. In addition to the example in FIG. 1B, all of the plurality of first laser elements 30a can be provided in a single first submount 32a extending in the X-direction, and/or all of the plurality of second laser elements 30b can be provided in a single second submount 32b extending in the X-direction.

The first laser elements 30a and the second laser elements 30b are, for example, semiconductor laser elements. Each semiconductor laser element has a structure in which, for example, an n-type clad layer, an active layer, and a p-type clad layer are layered in sequence in the Z-direction. Each semiconductor laser element further includes an electrode positioned on the n-type clad layer side, and an electrode positioned on the p-type clad layer side. In the present specification, the electrode on the n-type clad layer side is referred to as "the n-side electrode", and the electrode on the p-type clad layer side is referred to as "the p-side electrode". By applying voltage to the n-side electrode and the p-side electrode and causing current of at least the threshold value to pass, the laser light is emitted in the direction parallel to the Y-direction from the end surface of the active layer. The spot of the emitted laser light has an oval shape in which the Z-direction is the major axis and the X-direction is the short axis in the far field. The semiconductor contained in the semiconductor laser elements is not specified. The semiconductor laser elements can contain, for example, an arsenide semiconductor such as GaAs, or a nitride semiconductor such as GaN. The semiconductor laser elements can emit laser light of any of the long wavelength, mid-wavelength, and short wavelength in the visible field. Depending on the intended use, the semiconductor laser elements can emit infrared laser light, or ultraviolet laser light. The plurality of first laser elements 30a and the plurality of second laser elements 30b in FIG. 1B can all emit laser light having an identical wavelength, or at least one of them can emit laser light having a different wavelength.

Optical Member 40

The optical member 40 includes a plane region, which is the bonding region with the upper surface 20s of the projection 20. In bonding the optical member 40 and the projection 20, for example, a metal bonding member containing an organic solvent can be used. As seen in a top view, the center of gravity of the optical member 40 is in the plane region. This allows the optical member 40 to be stably provided on the upper surface 20s of the projection 20. As a result, the optical member 40 and the projection 20 are less likely to be separated from each other in use of the light emitting device 100.

In the manufacturing method of the light emitting device 100, in bonding the optical member 40 to the projection 20, the optical member 40 is less likely to tilt and largely displace during curing the bonding member. This can eliminate the necessity of quickly bonding the optical member 40 and the projection 20 to each other, and a bonding member of which bonding temperature is low can be employed in bonding the optical member 40 and the projection 20 to each other.

The metal bonding member containing an organic solvent can be, for example, metal paste such as gold paste or silver paste. The organic solvent contained in the metal paste can be evaporated during the bonding. The bonding temperature of the metal paste is 230° C. or less, which is lower than the bonding temperature (about 310° C.) of the AuSn bonding member used as the metal bonding member. That is, the metal paste is the metal bonding member containing an organic solvent, and is an example of the bonding member of which bonding temperature is low. The low temperature bonding can inhibit damaging to the first laser elements 30a and the second laser elements 30b due to heat. The organic solvent is vaporized in the bonding process, to thereby reduce the influence of dust collection attributed to laser light emission from the first laser elements 30a or the second laser elements 30b.

The lenses included in the optical member 40 can be formed of at least one selected from the group consisting of, for example, glass, quartz, synthetic quartz, sapphire, transparent ceramic, and plastic. In order to collimate, converge, or diverse the laser light having an oval spot, each lens can have a circular or oval shape as seen in a top view, for example. The thickness of the optical member 40 in the Z-direction is in a range of, for example, 2.0 mm to 5.0 mm inclusive.

A Pair of First Electrode Pads 50a and a Pair of Second Electrode Pads 50b

For wirings, which will be described later, a pair of first electrode pads 50a and a pair of second electrode pads 50b are provided on the main surface 10s. The position of the pair of first electrode pads 50a and the pair of second electrode pads 50b is not particularly specified. The pair of first electrode pads 50a and the pair of second electrode pads 50b are not necessarily provided.

Frame Part 60, a Pair of First Leads 62a, and a Pair of Second Leads 62b

The light emitting device 100 includes, in addition to main constituents, a frame body 60, a pair of first leads 62a, and a pair of second leads 62b.

The frame body 60 forms a frame by the lateral surfaces that extend upward (or in the Z-direction) from the main surface 10s. The frame body 60 can be provided as an individual constituent on the main surface 10s of the substrate 10, or integrated with the substrate 10. In relation to the order in the manufacturing processes, a plurality of constituents can be provided on the main surface 10s of the substrate 10, and thereafter the frame body 60 can be provided. Alternatively, the frame body 60 as a separate constituent can be provided on the main surface 10s of the substrate 10, or an integrated body of the frame body 60 and the substrate 10 can be provided, and subsequently a plurality of constituent components can be provided on the main surface 10s inward of the frame formed by the frame body 60 of that structure. The integrated body of the frame body 60 and the substrate 10 can be referred to as "the base member".

On the frame body 60, the pair of first leads 62a and the pair of second leads 62b, a lead sealing member, such as SiO$_2$, which seals the clearance between the leads and the frame body 60, and the cover 70 are mounted. In the case in which the coefficient of thermal expansion of the frame body 60 is close to the coefficient of thermal expansion of these constituent components, the constituent components are less likely to be separated and damaged even in the case in which the frame body 60 deforms according to variations in temperature. This maintains hermeticity in the space where the laser elements are disposed in the light emitting device 100. Taking into consideration of the coefficient of thermal expansion, the frame body 60 can be formed of, for example, a SPC (Steel Plate Cold) member. The SPC member is advantageous also in its being easily press-worked. In the case in which the frame body 60 is integrated with the substrate 10, the frame body 60 is formed of the material identical to that of the substrate 10. The height of the frame body 60 in the Z-direction is in a range of, for example, 4.0 mm to 10.0 mm inclusive. An top view of the frame body 60 can have, for example one shape selected from the group consisting of a quadrangle, a polygon, a circle, an oval, and any shape similar to the foregoing. In FIG. 1A, the frame body 60 has a quadrangular shape formed of four lateral surfaces as seen in a top view.

The pair of first leads 62a and the pair of second leads 62b pass through the lateral surfaces that form the frame. The pair of first leads 62a and the pair of second leads 62b are formed of a conductive material. In the case in which the frame body 60 is conductive, between the pair of first leads 62a and the frame body 60 and between the pair of second leads 62b and the frame body 60 are insulated by the lead sealing member. The pair of first leads 62a is used for electrical connection of the first laser elements 30a, and the pair of second leads 62b is used for electrical connection of the second laser elements 30b. The first leads 62a respectively penetrate through two opposite lateral surfaces parallel to the YZ-plane on the first reflective part 22a side with reference to the projection 20. The second leads 62b respectively penetrate through two opposite lateral surfaces parallel to the YZ-plane on the second reflective part 22b side with reference to the projection 20. Note that, as used herein, "with reference to the projection 20" means that a plane parallel to the XZ-plane that intersects the projection 20 is referred to.

Exemplary wirings for the pair of first leads 62a, the pair of first electrode pads 50a, and at least one first laser element 30a, and exemplary wirings for the pair of second leads 62b, the pair of second electrode pads 50b, and at least one second laser element 30b will be described later.

The height of the frame body 60 in the Z-direction is greater than the sum of the height of the projection 20 in the Z-direction and the height of the optical member 40 in the Z-direction. Thus, the optical member 40 is accommodated in the frame body 60 in the X-direction, the Y-direction, and the Z-direction.

Note that, the light emitting device may not include part or all of the frame body 60, the pair of first leads 62a, and the pair of second leads 62b.

Cover 70

The cover 70 is light-transmissive, and covers the frame of the frame body 60 at the position opposing to the main surface 10s. Thus, in the light emitting device 100, the first laser elements 30a and the second laser elements 30b are disposed in the hermetically sealed space. This also avoids contact between any foreign object and the constituent components disposed in the package of the light emitting device 100, thereby inhibiting any breakage of the light emitting device 100. The cover 70 can be formed of, for example, at least one selected from the group consisting of glass, sapphire, ceramic, and resin. The cover 70 can have the function of converting the wavelength of laser light, or the function of diverging laser light. The frame of the frame body 60 and the cover 70 can be bonded to each other by, for example, metal welding. This can reduce the possibility of the collection of dust, even in the case in which laser light of a short wavelength is emitted from at least one of the first laser elements 30a and the second laser elements 30b. The thickness in the Z-direction of the cover 70 is in a range of, for example, 0.05 mm to 0.2 mm inclusive. The optical member 40 is positioned inward of the frame of the frame body 60 and between the main surface 10s and the cover 70. This can reduce the thickness of the light emitting device 100.

As shown in FIG. 1A, in the case in which the frame of the frame body 60 and the cover 70 are directly bonded to each other, stress may be applied to the cover 70 due to deformation of the frame body 60 attributed to temperature change. This may result in breakage of the cover 70.

Figure 1D:
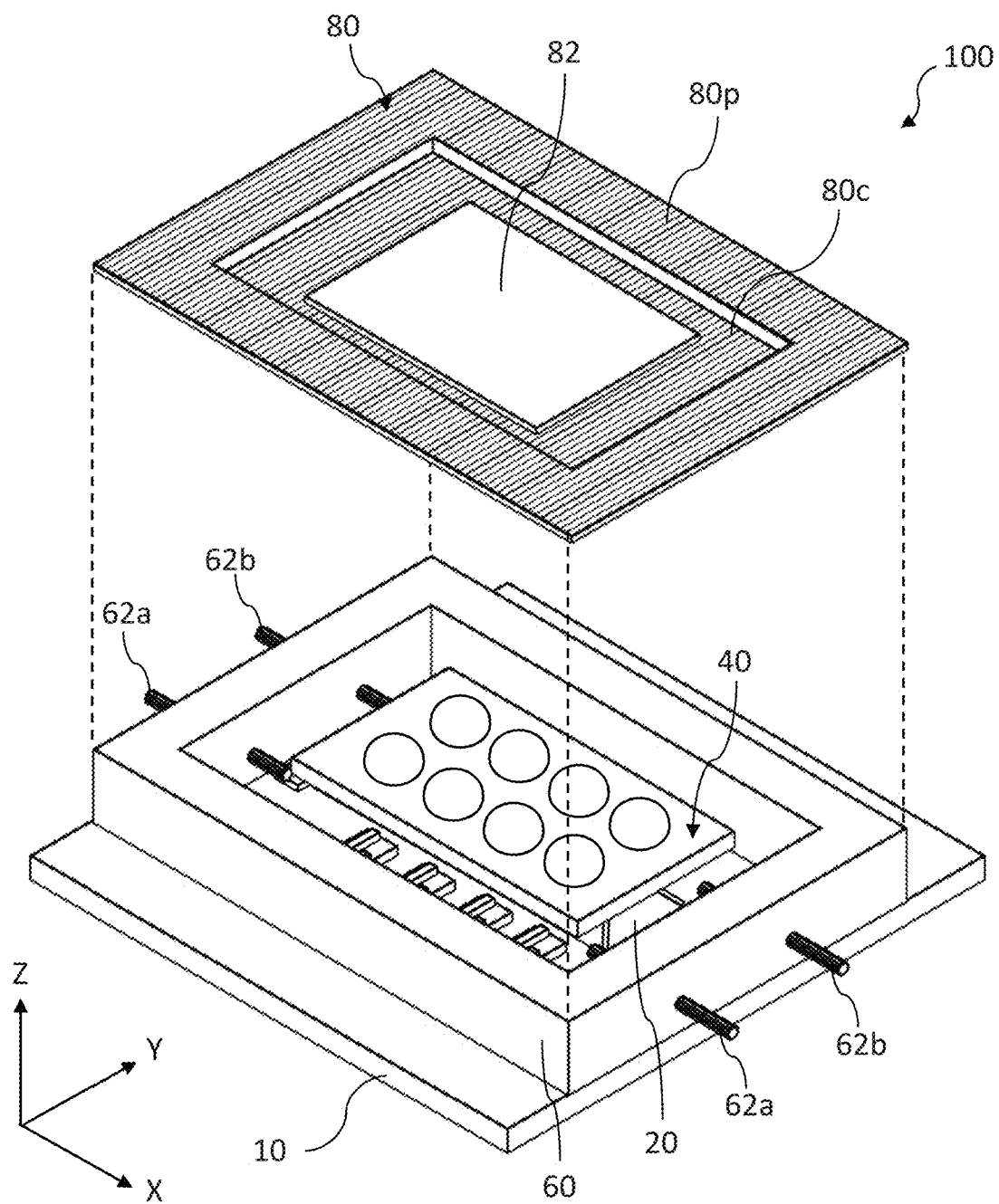
FIG. 1D is a perspective view schematically showing the light emitting device in FIG. 1A including a lid in place of the cover.
Figure 1E:
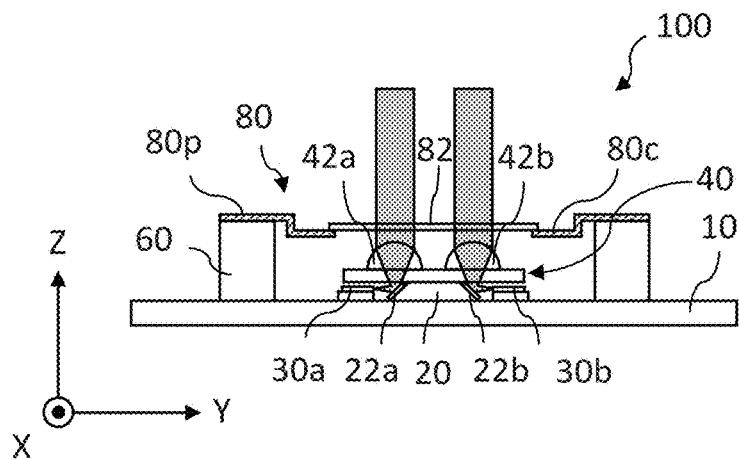
FIG. 1E is a cross-sectional view in the YZ-plane of the light emitting device in FIG. 1D.

FIG. 1D is a perspective view schematically showing an example in which the light emitting device 100 in FIG. 1A includes a lid 80 in place of the cover 70. For the sake of convenience, FIG. 1D shows the frame body 60 and the lid 80 as being separated from each other. Practically, the frame body 60 and the lid 80 are bonded to each other. FIG. 1E is a cross-sectional view in the YZ-plane of the light emitting device 100 in FIG. 1D.

Lid 80

A peripheral part 80p of the lid 80 is supported by the frame of the frame body 60. The central part 80c of the lid 80 is recessed toward the main surface 10s than the peripheral part 80p of the lid 80. The central part 80c of the lid 80 is positioned above the optical member 40. The frame of the frame body 60 is higher in the Z-direction than the frame of the frame body 60 shown in FIGS. 1A to 1C, so that the central part 80c of the lid 80 is accommodated in the frame body 60 in the X-direction, the Y-direction, and the Z-direction. The lid 80 has an opening at the central part 80c. As seen in a top view, at least one of the first lens part 42a and the second lens part 42b in the optical member 40 is positioned in the opening of the lid 80 at the central part 80c. The lid 80 includes, at its central part 80c, a single light-transmissive member 82 that closes the opening. In the lid 80, even in the case in which the frame body 60 deforms due to variations in temperature, the walls parallel to the Z-direction connecting between the peripheral part 80p and the central part 80c can reduce the stress applied to the light-transmissive member 82. As a result, the light-transmissive member 82 becomes less likely to be broken. In the lid 80, portions other than the light-transmissive member 82 are preferably formed of a material of which coefficient of linear expansion is similar to that of the lid 80. Examples of such materials include alloy of Ni and Fe. Note that, such portions can be formed of the material identical to that of the frame body 60. The light-transmissive member 82 can be formed of the material identical to that of the cover 70. The bonding between the frame of the frame body 60 and the lid 80 is as described above in relation to the bonding between the frame of the frame body 60 and the cover 70.

As shown in FIG. 1E, laser light beams emitted from the first laser elements 30a and the second laser elements 30b are respectively reflected by the first reflective part 22a and the second reflective part 22b, collimated by the first lens part 42a and the second lens part 42b, and transmitted and emitted to the outside through the light-transmissive member 82 in the lid 80. Separately from the example shown in FIGS. 1D and 1E, the lid 80 can include a plurality of light-transmissive members that respectively close a plurality of openings. The plurality of openings respectively includes a plurality of lenses of the first lens part 42a and the second lens part 42b in the optical member 40 at the central part 80c as seen in a top view. The light emitting device 100 can further include the cover 70 that covers the lid 80. This can improve hermeticity in the light emitting device 100.

Next, a description will be given of exemplary wirings in the light emitting device 100.

Figure 2:
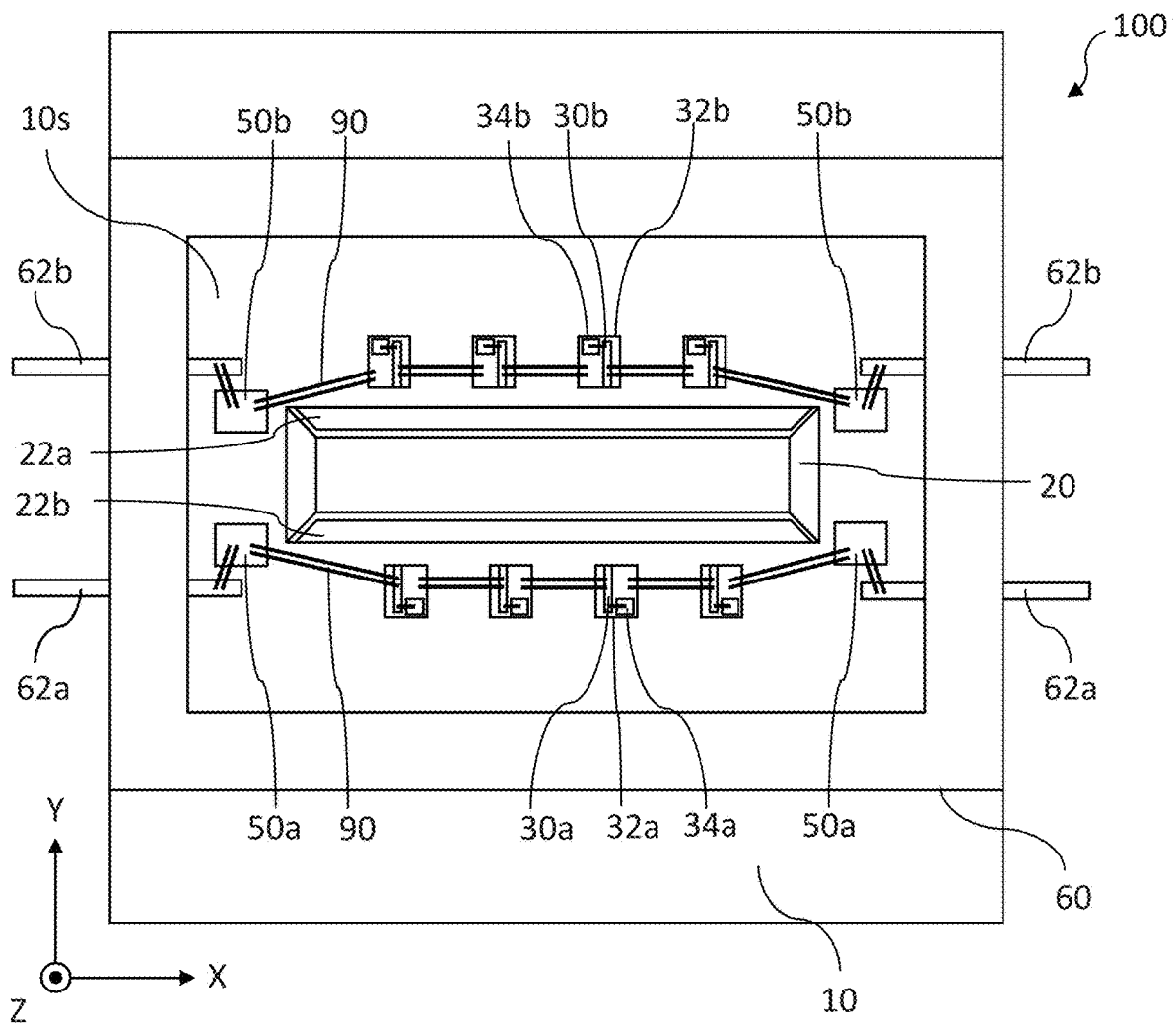
FIG. 2 is a plan view schematically showing exemplary wirings in the light emitting device.

FIG. 2 is a plan view schematically showing exemplary wirings in the light emitting device 100. In FIG. 2, the optical member 40 and the cover 70 or the lid 80 of the light emitting device 100 are omitted. The bold lines in FIG. 2 represent conductive wires 90 used as connection wirings. The wires 90 are bonded by, for example, wire bonding or die bonding.

The wires 90 can be formed of, for example, at least one selected from the group consisting of gold, silver, copper, and aluminum. The wirings for the pair of first leads 62a, the pair of first electrode pads 50a, and the plurality of first laser elements 30a are as follows. The pair of first leads 62a is connected to the pair of first electrode pads 50a. In the pair of first electrode pads 50a, one is connected to the p-side electrode of the first laser element 30a nearest from that first electrode pad 50a with two wires 90; and the other is connected to the first submount 32a nearest from that first electrode pad 50a with two wires 90. The rest of the first laser elements 30a each have the p-side electrode connected to the first submount 32a adjacent to its first submount 32a with two wires 90; and each have the n-side electrode connected to the electrode pad 34a for the first laser element 30a on its first submount 32a with one wire 90. As shown in FIG. 2, although the connection with two wires 90 can reduce the risk of breakage, the connection can be established with one wire 90. The number of the wires 90 can be adjusted as appropriate according to the size and disposition of the constituents and the intended use. Note that, although the pair of first leads 62a and the plurality of first laser elements 30a are connected with the wires 90 via the pair of first electrode pads 50a, the plurality of first submounts 32a, and the plurality of electrode pads 34a for the first laser elements 30a, they can be directly connected with the wires 90 without intervention of such elements. In the following description, the connection with the wires 90 via the submounts and pads are referred to as "the indirect connection", and the connection with the wires 90 without the intervention of such elements is referred to as "the direct connection".

Summarizing the foregoing, in the pair of first leads 62a, one is directly or indirectly connected to the p-side electrode of the first laser element 30a nearest from that first lead 62a with the wires 90; and the other is directly or indirectly connected to the n-side electrode of the first laser element 30a nearest to that first lead 62a with the wires 90. The rest of the first laser elements 30a each have the p-side electrode directly or indirectly connected to the n-side electrode of one of two adjacent first laser elements 30a with the wires 90; and each have the n-side electrode directly or indirectly connected to the p-side electrode of the other one of the two adjacent first laser elements 30a with the wires 90. The p-side and the n-side may be interchanged. The same holds true for the wirings for the pair of second leads 62b, the pair of second electrode pads 50b, and the plurality of second laser elements 30b.

The provision of the pair of first leads 62a and the pair of second leads 62b allows the plurality of first laser elements 30a and the plurality of second laser elements 30b to be independently driven. An increase in the number of the first laser element 30a and the plurality of second laser elements 30b will not necessitate provision of new leads.

Note that, in the case in which the plurality of first laser elements 30a and the plurality of second laser elements 30b are simultaneously driven, one first lead 62a, one first electrode pad 50a nearest to that first lead 62a, the plurality of first laser elements 30a, the other first electrode pad 50a, one second electrode pad 50b nearest to the other first electrode pad 50a, the plurality of second laser elements 30b, the other second electrode pad 50b, and the second lead 62b nearest to the other second electrode pad 50b are connected in series in sequence. In this case, just two leads penetrating through the identical lateral surface shown in FIG. 2 are used.

The optical member 40 is provided on the upper surface 20s of the projection 20 after the wirings are provided.

Variation

Next, a description will be given of variations of the light emitting device of the present disclosure. In the following, those described with reference to FIGS. 1A to 1E and 2 may not be repetitively described.

Figure 3A:
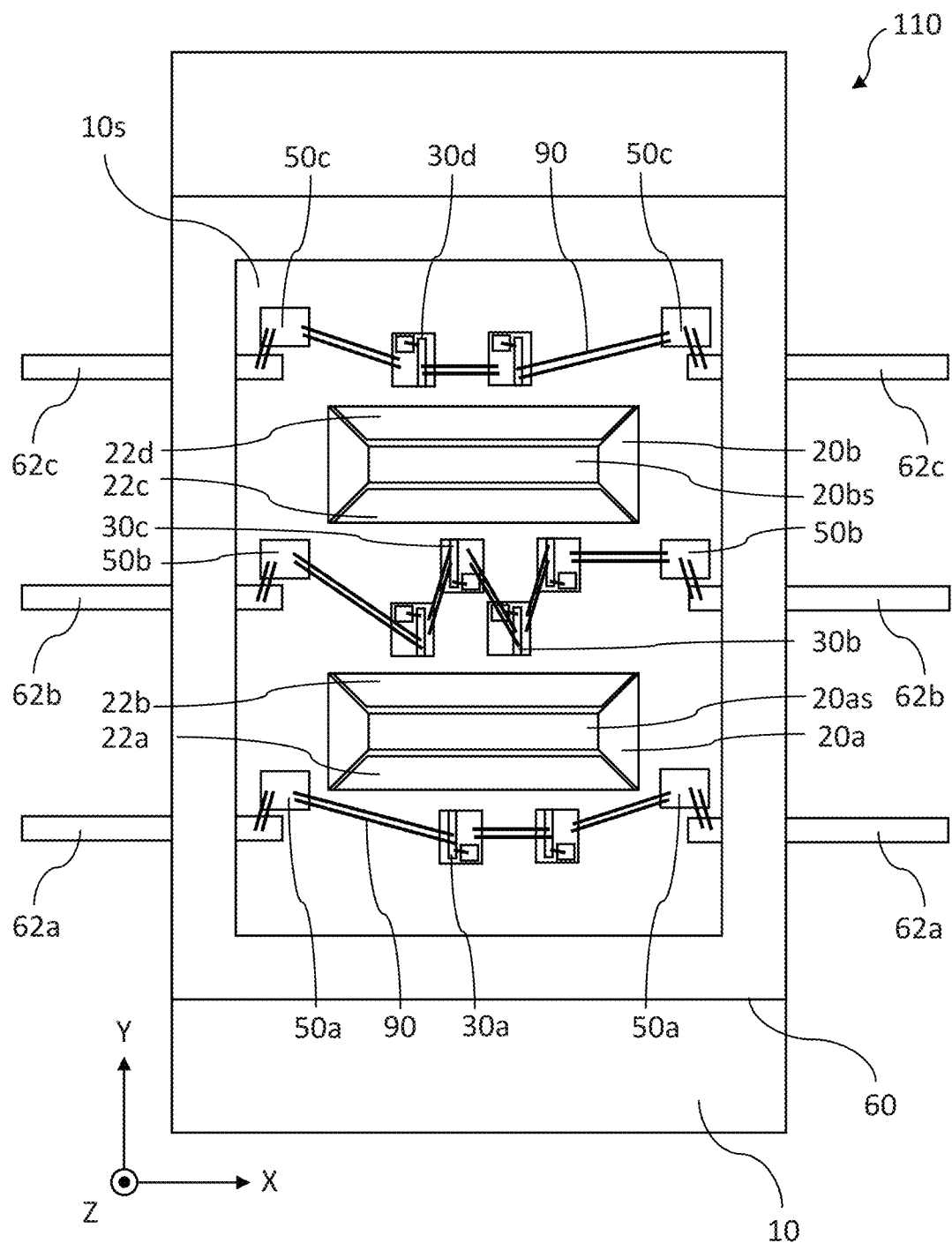
FIG. 3A is a plan view schematically showing exemplary wirings in a light emitting device according to a first variation.
Figure 3B:
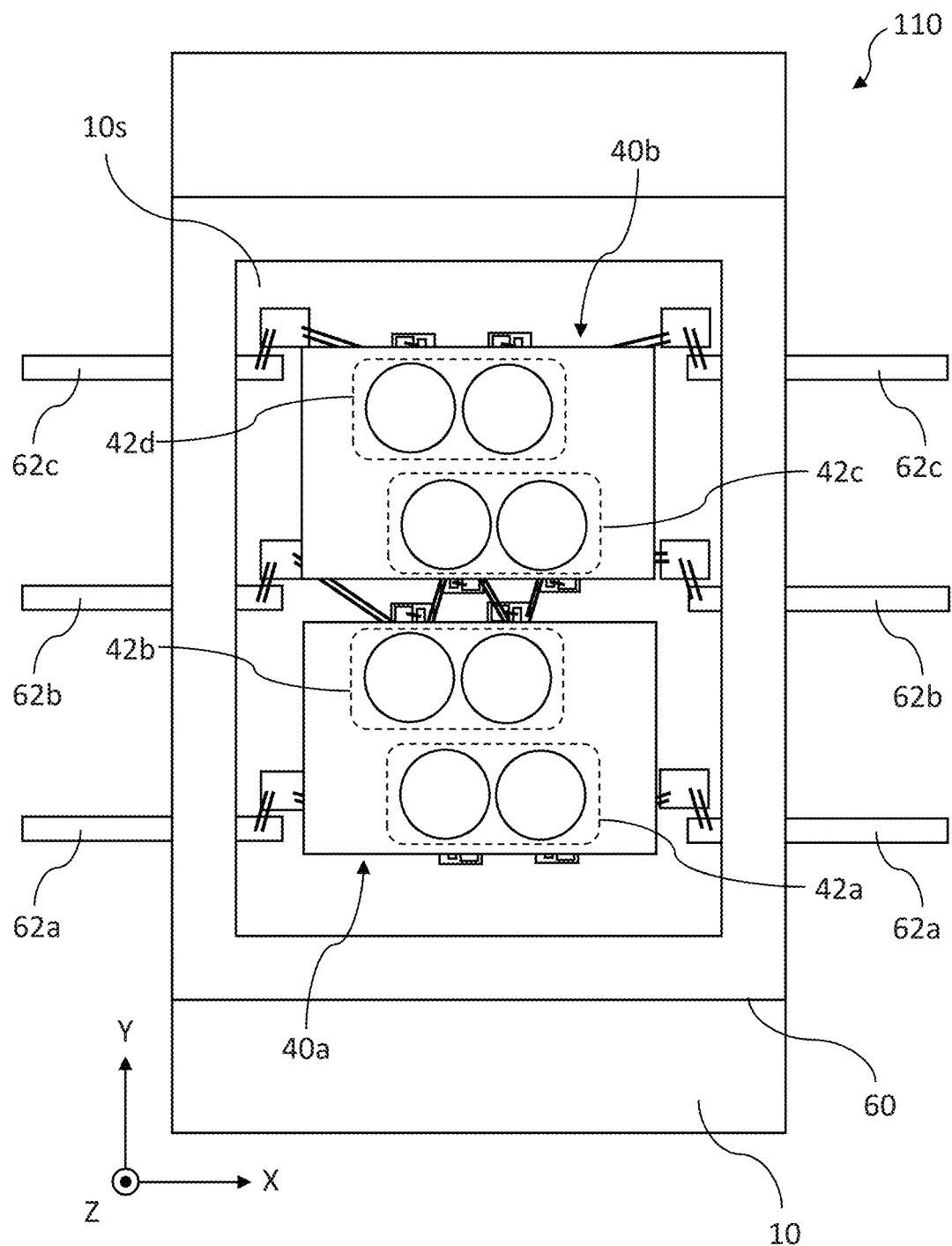
FIG. 3B is a plan view schematically showing the light emitting device according to the first variation.

FIG. 3A is a plan view schematically showing exemplary wirings in a light emitting device 110 according to a first variation. FIG. 3B is a plan view schematically showing the light emitting device 110 according to the first variation. In FIG. 3A, a first optical member 40a and a second optical member 40b that are shown in FIG. 3B are omitted. In FIG. 3B, the cover 70 or the lid 80 of the light emitting device 110 is omitted due to above repetitively description.

The light emitting device 110 includes the substrate 10, and on the substrate 10, a first projection 20a, a second projection 20b, two first laser elements 30a, two second laser elements 30b, two third laser elements 30c, two fourth laser elements 30d, a pair of first electrode pads 50a, a pair of second electrode pads 50b, a pair of third electrode pads 50c, and the frame body 60. The number of the first laser elements 30a to the fourth laser elements 30d is not specified, but should each be at least one. On the first projection 20a, the first optical member 40a is provided. On the second projection 20b, the second optical member 40b is provided. The frame body 60 is provided with a pair of first leads 62a, a pair of second leads 62b, and a pair of third leads 62c.

In the following, a description will be given of the constituent components in FIG. 3A.

The first projection 20a and the second projection 20b are positioned parallel to each other on the main surface 10s. The first projection 20a and the second projection 20b are similar in shape to the above-described projection 20. The first projection 20a and the second projection 20b each have a reflective part in each of the two lateral surfaces parallel to the X-direction. Herein, it is defined that the reflective part of the first lateral surface of the first projection 20a is the first reflective part 22a; the reflective part of the second lateral surface of the first projection 20a is the second reflective part 22b; the reflective part of one lateral surface of the second projection 20b is the third reflective part 22c; and the reflective part of the other lateral surface of the second projection 20b is the fourth reflective part 22d.

At least one laser element is disposed for each reflective part to irradiate laser light to the corresponding reflective part. Herein, with reference to the first projection 20a, the laser elements positioned on the first reflective part 22a side and irradiating laser light to the first reflective part 22a are referred to as the first laser elements 30a, and the laser elements positioned on the second reflective part 22b side and irradiating laser light to the second reflective part 22b are referred to as the second laser elements 30b; with reference to the second projection 20b, the laser elements positioned on the third reflective part 22c side and irradiating laser light to the third reflective part 22c are referred to as the third laser elements 30c, and the laser elements positioned on the fourth reflective part 22d side and irradiating laser light to the fourth reflective part 22d are referred to as the fourth laser elements 30d. The second laser elements 30b and the third laser elements 30c are positioned between the first projection 20a and the second projection 20b. In FIG. 3A, a plurality of first laser elements 30a, a plurality of second laser elements 30b, a plurality of third laser elements 30c, and a plurality of fourth laser elements 30d are arranged in the X-direction. The gap between any laser element and corresponding reflective part is constant over the laser elements. Defining the respective gaps as the first gap, the second gap, the third gap, and the fourth gap, the first to fourth gaps are equal to one another. Note that, they may not be constant or equal.

The frame body 60 is as described above. The pair of first leads 62a, the pair of second leads 62b, and the pair of third leads 62c respectively penetrate through two opposing lateral surfaces parallel to the YZ-plane out of the lateral surfaces that form the frame of the frame body 60. The pair of first leads 62a penetrates through two opposing lateral surfaces parallel to the YZ-plane at the first reflective part 22a side with reference to the first projection 20a. The pair of second leads 62b penetrates through two opposing lateral surfaces parallel to the YZ-plane at the second reflective part 22b side with reference to the first projection 20a and on the third reflective part 22c side with reference to the second projection 20b. The pair of third leads 62c penetrates through two opposing lateral surfaces parallel to the YZ-plane at the fourth reflective part 22d side with reference to the second projection 20b. Note that, as used herein, "with reference to the first projection 20a" means that a plane parallel to the XZ-plane that intersects the first projection 20a is reference. "With reference to the second projection 20b" means that a plane parallel to the XZ-plane that intersects the second projection 20b is reference.

The pair of first leads 62a is used in electrically connecting the first laser elements 30a; the pair of second leads 62b is used in electrically connecting the second laser elements 30b and the third laser elements 30c; and the pair of third leads 62c is used in electrically connecting the fourth laser elements 30d. The electric connection is established via the pair of first electrode pads 50a, the pair of second electrode pads 50b, and the pair of third electrode pads 50c. Thus, as compared to the case in which electric connection of the second laser elements 30b and the third laser element 30c is established using separate leads, the present embodiment reduces the number of leads and electrode pads. Note that, the electrode pads may be dispensed with. The exemplary wirings are the wires 90 represented by the bold lines in FIG. 3A.

In FIG. 3B, the first optical member 40a is fixed to an upper surface 20as of the first projection 20a, and the second optical member 40b is fixed to an upper surface 20bs of the second projection 20b. The center of gravity of the first optical member 40a overlaps with the upper surface 20as of the first projection 20a as seen in a top view, and the center of gravity of the second optical member 40b overlaps with the upper surface 20bs of the second projection 20b as seen in a top view. This allows the first optical member 40a and the second optical member 40b to be stably provided. The optical members being two in number facilitates alignment with the laser elements, as compared to the case in which optical control is exerted over the first laser elements 30a to the fourth laser elements 30d with a single optical member. The first optical member 40a and the second optical member 40b are accommodated in the frame body 60 in the X-direction, the Y-direction, and the Z-direction. This may realize downsizing the light emitting device 110.

The first optical member 40a includes the first lens part 42a positioned above the first reflective part 22a, and the second lens part 42b positioned above the second reflective part 22b. The second optical member 40b includes a third lens part 42c positioned above the third reflective part 22c, and a fourth lens part 42d positioned above the fourth reflective part 22d.

In the case in which the first laser element 30a is one in number, the first lens part 42a includes one lens. In the case in which the first laser elements 30a are two or more in number, the first lens part 42a is a first lens array that includes lenses respectively corresponding to the plurality of first laser elements 30a. The same holds true for the relationship of the second laser elements 30b to the fourth laser elements 30d and the second lens part 42b to the fourth lens part 42d. The first optical member 40a can include a lens part other than the first lens part 42a and the second lens part 42b. The same holds true for the second optical member 40b. The light emitting device 110 shown in FIG. 3B is hermetically sealed by the cover 70 or the lid 80. On the other hand, in the case in which the first laser elements 30a to the fourth laser elements 30d emit laser light with a long wavelength, the light emitting device 110 in FIG. 3B is not necessarily hermetically sealed by the cover 70 or the lid 80.

Note that, in the case in which the number of the pairs of leads does not have to be reduced, a pair of leads can be used in establishing electric connection for each of the first laser elements 30a to the fourth laser elements 30d. In this case, four pairs of leads are used.

Note that, the light emitting device may not include part or all of the pair of first electrode pads 50a to the pair of third electrode pads 50c, the frame body 60, and the pair of first leads 62a to the pair of third leads 62c.

While the projection 20 shown in FIGS. 1A to 1E and 2 and the first projection 20a and the second projection 20b shown in FIGS. 3A and 3B each have a ridge-shape that extends in the X-direction, the shape of each projection is not limited thereto.

Figure 4A:
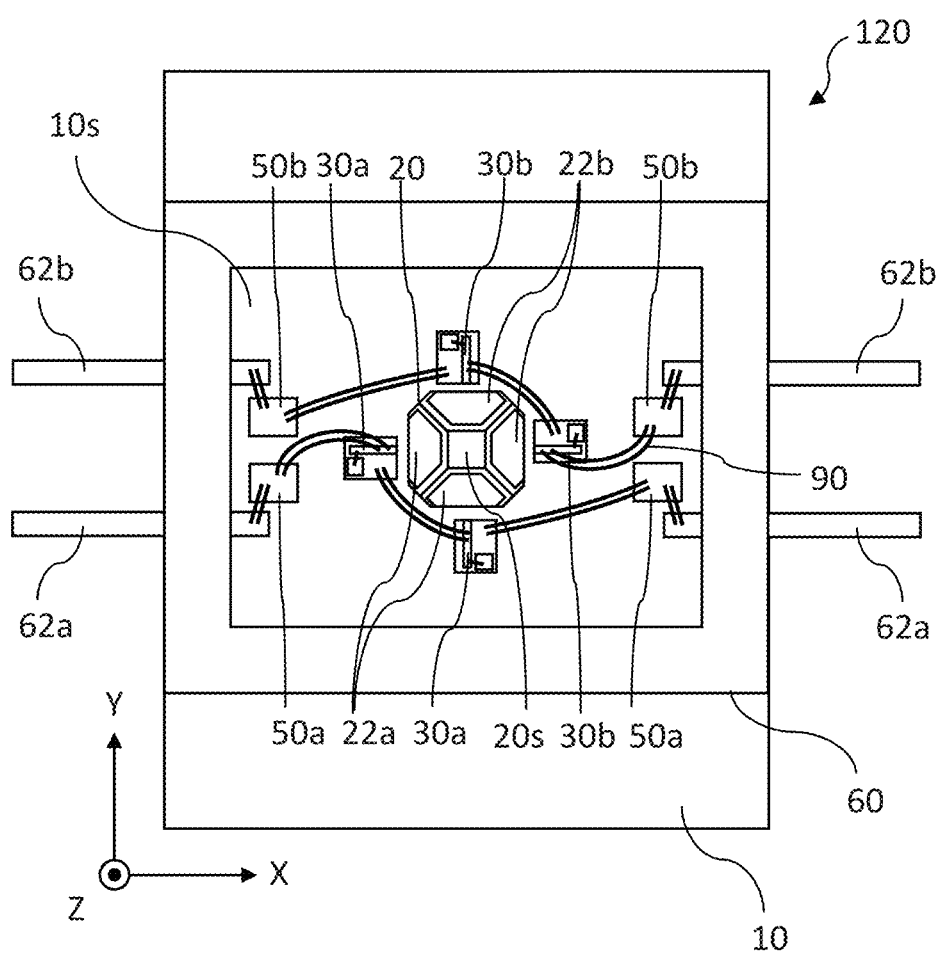
FIG. 4A is a plan view schematically showing exemplary wirings in a light emitting device according to a second variation.
Figure 4B:
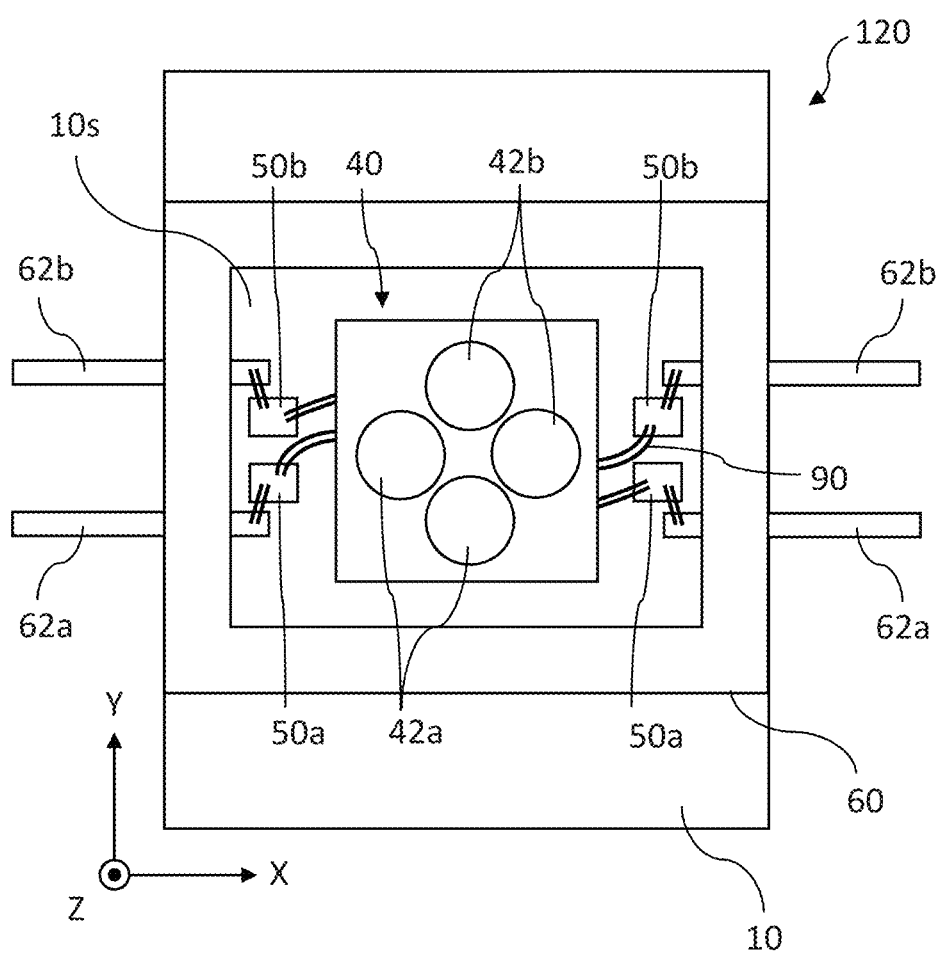
FIG. 4B is a plan view schematically showing the light emitting device according to the second variation.

FIG. 4A is a plan view schematically showing exemplary wirings in a light emitting device 120 according to a second variation. FIG. 4B is a plan view schematically showing the light emitting device 120 according to the second variation. In FIG. 4A, the optical member 40 in FIG. 4B is omitted. In FIG. 4B, the cover 70 or the lid 80 of the light emitting device 120 is omitted.

The light emitting device 120 includes the substrate 10, and on the substrate 10, the projection 20, two first laser elements 30a, two second laser elements 30b, the pair of first electrode pads 50a, the pair of second electrode pads 50b, and the frame body 60. The number of the first laser elements 30a and the second laser elements 30b is not specified, and should each be at least one. On the projection 20, the optical member 40 is provided. The frame body 60 is provided with the pair of first leads 62a and the pair of second leads 62b.

In the following, a description will be given of the constituent components in FIG. 4A.

The projection 20 has a shape of a frustum of a square pyramid. The projection 20 includes the upper surface 20s, two lateral surfaces (first and second lateral surfaces) parallel to the X-direction that meet the upper surface 20s, and two lateral surfaces (third and fourth lateral surfaces) parallel to the Y-direction that meet the upper surface 20s. These four lateral surfaces are oriented upward. In the two lateral surfaces parallel to the X-direction, the first lateral surface includes the first reflective part 22a, and the second lateral surface includes the second reflective part 22b. Similarly, in the two lateral surfaces parallel to the Y-direction, the third lateral surface includes a first reflective part 22a, and the fourth lateral surface includes a second reflective part 22b. That is, in a single projection 20, the first reflective parts 22a are respectively provided for a plurality of lateral surfaces, and the second reflective parts 22b are respectively provided so as to correspond to the first reflective parts 22a. The first reflective parts 22a are respectively provided at a plurality of lateral surfaces continuously connected to each other. Similarly, the second reflective parts 22b are respectively provided at a plurality of lateral surfaces continuously connected to each other.

The first laser elements 30a are positioned on the first reflective part 22a side with reference to the projection 20, and irradiate laser light to the first reflective parts 22a. The second laser elements 30b are positioned on the second reflective part 22b side with reference to the projection 20, and irradiate laser light to the second reflective parts 22b. In this manner, the first laser elements 30a and the second laser elements 30b are disposed such that their respective laser-light emission end surfaces opposed to each other as being oriented inward in the light emitting device 100. At least one first laser element 30a is provided for each first reflective part 22a. A plurality of first reflective parts 22a is respectively provided at two lateral surfaces continuous to each other in the projection 20 and, correspondingly, a plurality of first laser elements 30a is respectively provided along the two lateral surfaces. At least one second laser element 30b is provided for each second reflective part 22b. A plurality of second reflective parts 22b is respectively provided at the other two lateral surfaces continuous to each other in the projection 20 and, correspondingly, a plurality of second laser elements 30b is respectively provided along the other two lateral surfaces. The plurality of first reflective parts 22a and the plurality of second reflective parts 22b can all be continuous to one another. The gap between the laser elements and the reflective parts is as described above. The first laser elements 30a disposed respectively corresponding to the plurality of first reflective parts 22a can be laser elements that are different from one another in characteristic. For example, they can be laser elements different from one another in polarization. As a specific example, a laser element emitting laser light with p-polarization to one first reflective part 22a can be disposed, and a laser element emitting laser light with s-polarization to the other first reflective part 22a can be disposed. Alternatively, laser elements that are different from one another in light emission intensity, peak wavelength, or light emission color can be disposed.

The pair of first electrode pads 50a, the pair of second electrode pads 50b, the frame body 60, the pair of first leads 62a, and the pair of second leads 62b are as described above. The exemplary wirings are wires 90 represented by the bolds lines in FIG. 4A.

In FIG. 4B, the optical member 40 is fixed to the upper surface 20s of the projection 20. The center of gravity of the optical member 40 overlaps with the upper surface 20s of the projection 20 as seen in a top view. This allows the optical member 40 to be stably provided. The optical member 40 is accommodated in the frame body 60 in the X-direction, the Y-direction, and the Z-direction. This realizes downsizing the light emitting device 120.

The optical member 40 includes the first lens parts 42a respectively positioned above the first reflective parts 22a, and the second lens parts 42b respectively positioned above the second reflective parts 22b. Accordingly, the optical member 40 includes a plurality of first lens parts 42a and a plurality of second lens parts 42b. The optical member 40 can include a lens part other than the first lens parts 42a and the second lens parts 42b. The disposition of the cover 70 or the lid 80 in the light emitting device 120 in FIG. 4B is as described above.

As shown in FIGS. 4A and 4B, by the plurality of laser elements being provided around the projection 20 that has a shape of a frustum of a square pyramid, the intensity distribution of laser light emitted from the light emitting device 100 has a shape in which four spots are positioned at the apexes of a square. This allows four laser light beams to be emitted at regular intervals. Furthermore, for example, in the case in which laser elements with p-polarization and laser element with s-polarization are used in the light emitting device, they can be arranged so as to be perpendicular to each other. In this disposition, light with the p-polarization and light with the s-polarization are emitted as light with an identical polarization direction by being reflected by the reflective parts.

Figure 5A:
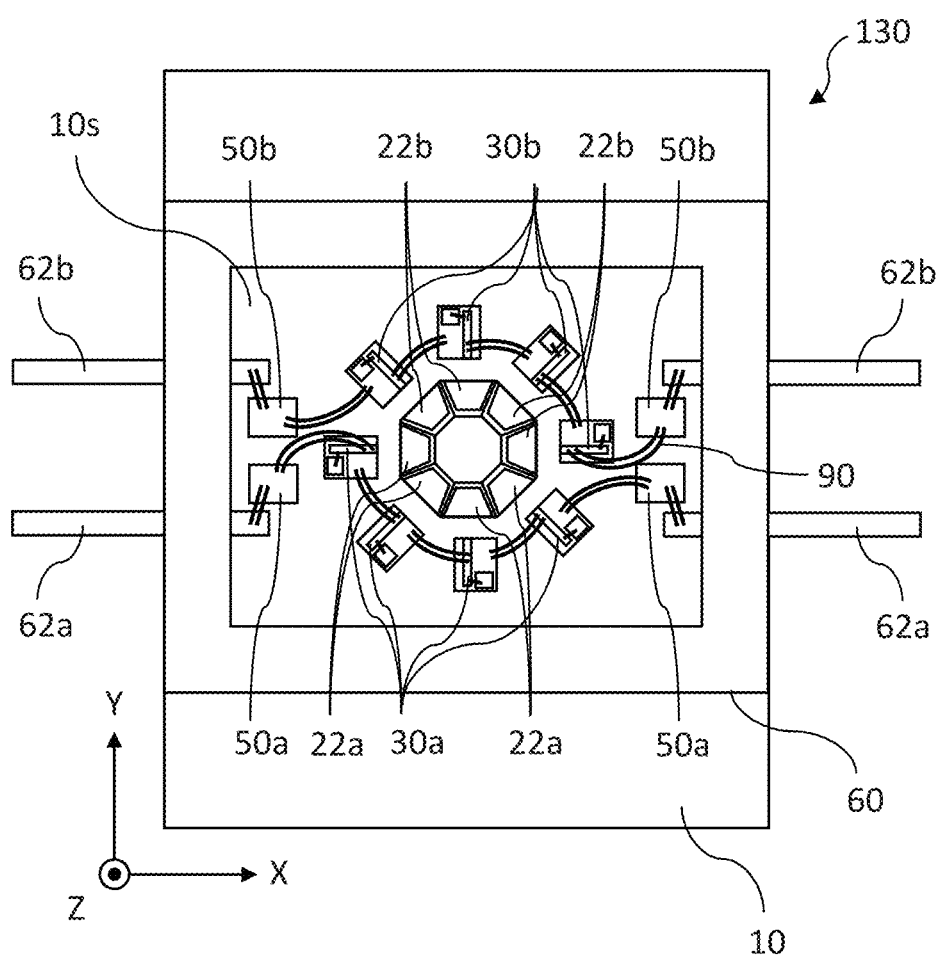
FIG. 5A is a plan view schematically showing exemplary wirings in a light emitting device according to a third variation.
Figure 5B:
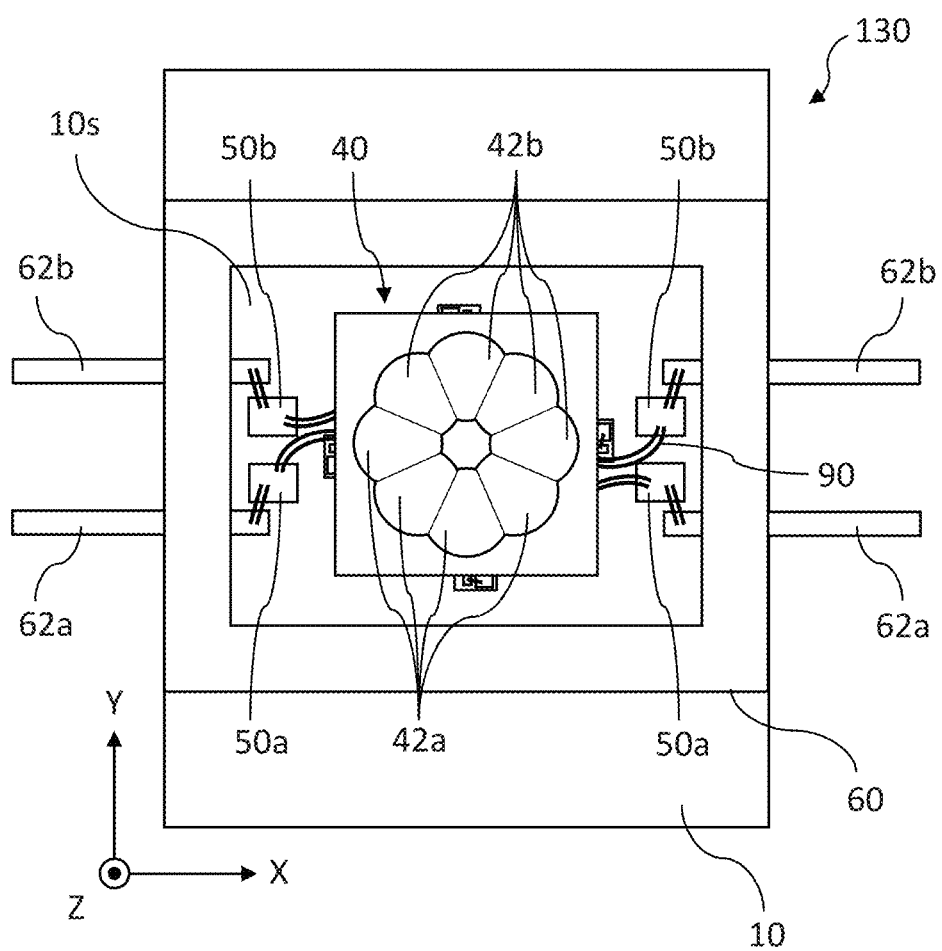
FIG. 5B is a plan view schematically showing the light emitting device according to the third variation.

FIG. 5A is a plan view schematically showing exemplary wirings in a light emitting device 130 according to a third variation. FIG. 5B is a plan view schematically showing the light emitting device 130 according to the third variation. In FIG. 5A, the optical member 40 in FIG. 5B is omitted. In FIG. 5B, the cover 70 or the lid 80 of the light emitting device 130 is omitted. FIG. 5A is different from FIG. 4A in that the projection 20 has a shape of a frustum of a right octagonal pyramid. The projection 20 includes the upper surface 20s, and eight lateral surfaces that meet the upper surface 20s. The eight lateral surfaces are oriented upward. The projection 20 includes first reflective parts 22a at respective continuous four lateral surfaces, and second reflective parts 22b at respective other four lateral surfaces.

The first laser elements 30a are positioned on the first reflective part 22a side with reference to the projection 20, and emit laser light to the first reflective parts 22a. The second laser elements 30b are positioned on the second reflective part 22b side with reference to the projection 20, and irradiate laser light to the second reflective parts 22b. The disposition of the first laser elements 30a and the first lens parts 42a for respective first reflective parts 22a is similar to that in the second variation. The disposition of the second laser elements 30b and the second lens parts 42b for respective second reflective parts 22b is similar to that in the second variation.

The pair of first electrode pads 50a, the pair of second electrode pads 50b, the frame body 60, the pair of first leads 62a, and the pair of second leads 62b are as described above. The exemplary wirings are the wires 90 represented by the bold lines in FIG. 5A.

In FIG. 5B, the optical member 40 is fixed to the upper surface 20s of the projection 20. The center of gravity of the optical member 40 overlaps with the upper surface 20s of the projection 20 as seen in a top view. This allows the optical member 40 to be stably provided. The optical member 40 is accommodated in the frame body 60 in the X-direction, the Y-direction, and the Z-direction. This can realize downsizing the light emitting device 130. The optical member 40 includes a plurality of annularly coupled lenses. The disposition of the cover 70 or the lid 80 in the light emitting device 130 in FIG. 5B is as described above.

As shown in FIGS. 5A and 5B, by the plurality of laser elements being provided around the projection 20 that has a shape of a frustum of a right octagonal pyramid, the intensity distribution of laser light emitted from the light emitting device 130 has a shape in which eight spots are annularly continuous. The light emitting device 130 is capable of gathering and emitting a greater amount of light as compared to the light emitting device 120 according to the second variation.

Note that, the constituent components in the frame body 60 in FIGS. 4A and 4B, or FIGS. 5A and 5B can be arranged in the Y-direction as shown in FIGS. 3A and 3B. Here, three or four pairs of leads can be used for electrical connection of the plurality of laser elements.

In the examples above, the optical member 40 is fixed to one projection 20, but the optical member 40 can be fixed to a plurality of projections.

Figure 6A:
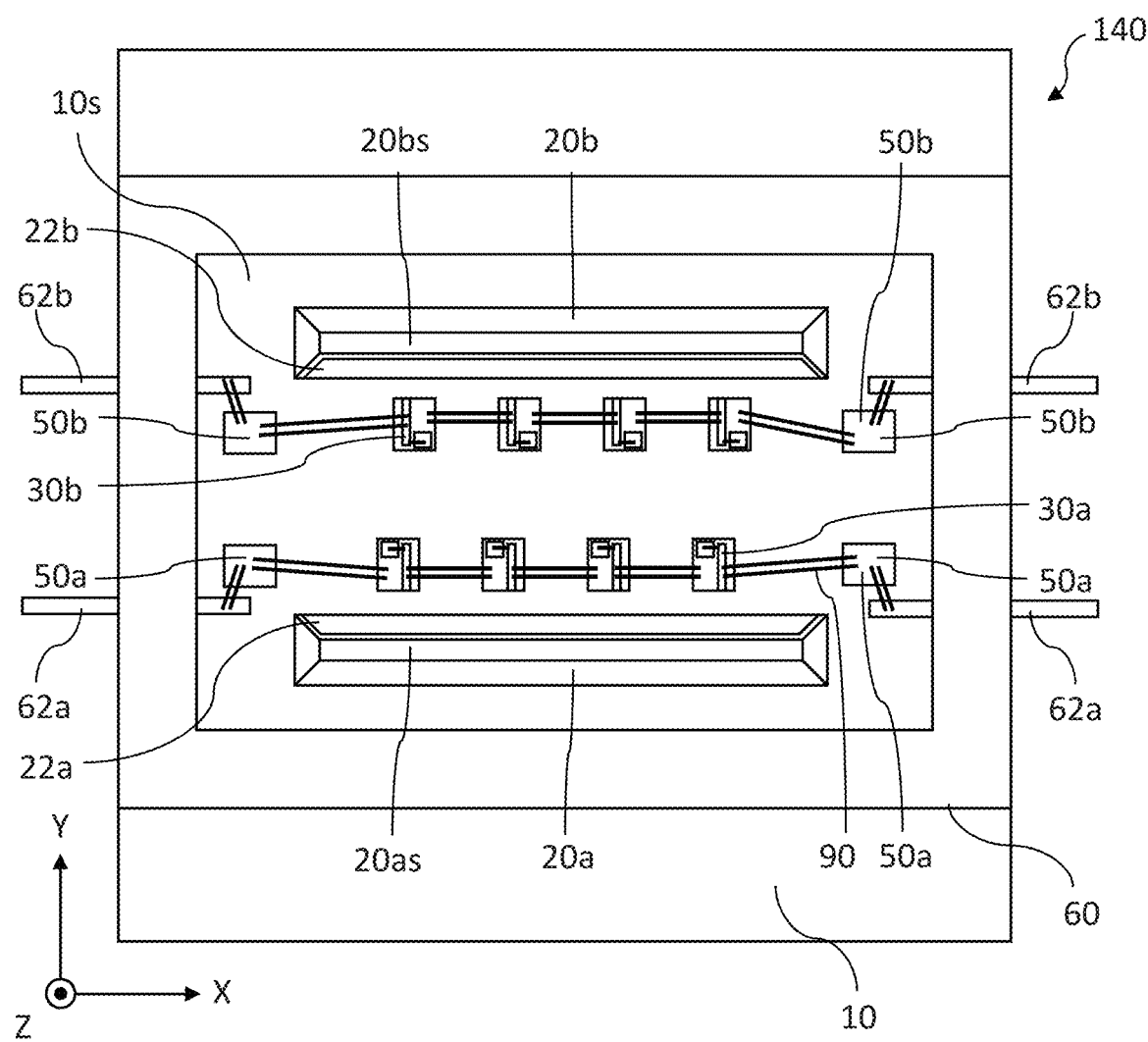
FIG. 6A is a plan view schematically showing exemplary wirings in a light emitting device according to a fourth variation.
Figure 6B:
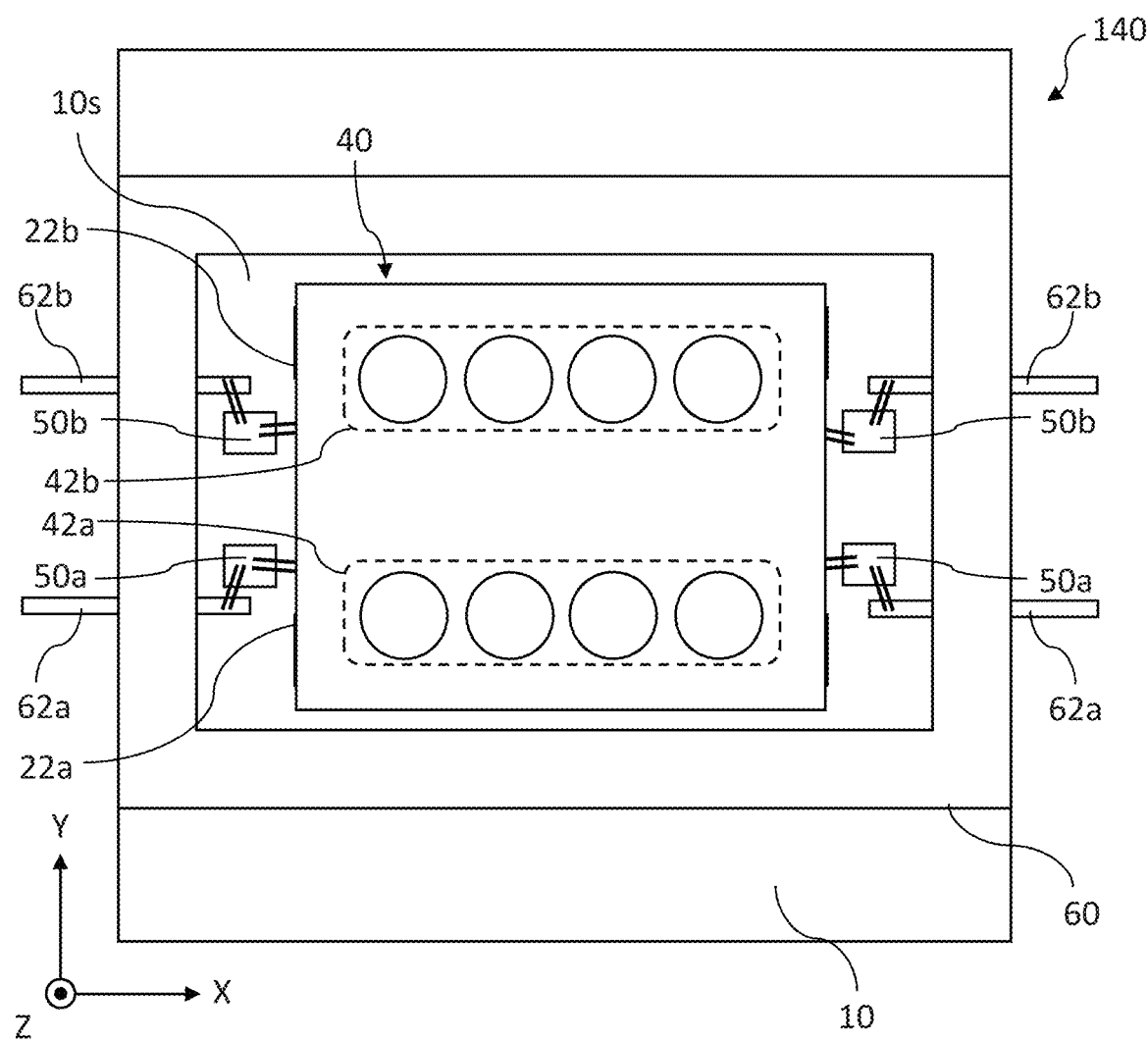
FIG. 6B is a plan view schematically showing the light emitting device according to the fourth variation.

FIG. 6A is a plan view schematically showing exemplary wirings in a light emitting device 140 according to a fourth variation. FIG. 6B is a plan view schematically showing the light emitting device 140 according to the fourth variation. In FIG. 6A, the optical member 40 in FIG. 6B is omitted. In FIG. 6B, the cover 70 or the lid 80 of the light emitting device 140 is omitted.

The light emitting device 140 includes the substrate 10, and on the substrate 10, the first projection 20a, the second projection 20b, four first laser elements 30a, four second laser elements 30b, the pair of first electrode pads 50a, the pair of second electrode pads 50b, and the frame body 60. The number of the first laser elements 30a and the second laser elements 30b is not specified, and should each be at least one. The first projection 20a and the second projection 20b support the optical member 40. The frame body 60 is provided with the pair of first leads 62a and the pair of second leads 62b.

In the following, a description will be given of the constituent components in FIG. 6A.

The first projection 20a and the second projection 20b each have a ridge-shape that extends in the X-direction. The first projection 20a includes, on the main surface 10s, the upper surface 20as, two lateral surfaces that are parallel to the X-direction and meet the upper surface 20as, and two lateral surfaces that are parallel to the Y-direction and meet the upper surface 20as. In the first projection 20a, one of the two lateral surfaces parallel to the X-direction includes the first reflective part 22a. The second projection 20b includes, on the main surface 10s, the upper surface 20bs, two lateral surfaces that are parallel to the X-direction and meet the upper surface 20bs, and two lateral surfaces that are parallel to the Y-direction and meet the upper surface 20bs. In the second projection 20b, one of the two lateral surfaces parallel to the X-direction includes the second reflective part 22b. The first projection 20a and the second projection 20b parallel to each other are positioned on the main surface 10s so that the first reflective part 22a and the second reflective part 22b oppose to each other.

The laser elements are disposed corresponding to respective reflective parts, and irradiate laser light to corresponding reflective parts. Herein, it is defined that the laser elements positioned on the first reflective part 22a side and irradiating laser light to the first reflective part 22a are the first laser elements 30a, and the laser elements positioned on the second reflective part 22b side and irradiating laser light to the second reflective part 22b are the second laser elements 30b. The laser-light emission end surfaces of the first laser elements 30a and the laser-light emission end surfaces of the second laser elements 30b are oriented in opposite directions. The gap between the laser elements and the reflective parts are as described above.

The frame body 60, the pair of first leads 62a, and the pair of second leads 62b are as described above. The exemplary wirings are the wires 90 represented by the bold lines in FIG. 6A.

In FIG. 6B, the optical member 40 is fixed to the upper surface 20as of the first projection 20a and the upper surface 20bs of the second projection 20b. It is not necessary for the center of gravity of the optical member 40 to overlap with the upper surface 20as of the first projection 20a or the upper surface 20bs of the second projection 20b as seen in a top view. In the case in which the center of gravity of the optical member 40 is positioned between the upper surface 20as of the first projection 20a and the upper surface 20bs of the second projection 20b as seen in a top view, the optical member 40 is stably provided. The optical member 40 is accommodated in the frame body 60 in the X-direction, the Y-direction, and the Z-direction. This can realize downsizing the light emitting device 140.

The optical member 40 includes the first lens part 42a positioned above the first reflective part 22a, and the second lens part 42b positioned above the second reflective part 22b. The optical member 40 can include any lens part other than the first lens part 42a and the second lens part 42b. The disposition of the cover 70 or the lid 80 in the light emitting device 140 in FIG. 6B is as described above.

Note that, the above-described light emitting device does not have to include all the constituent components shown in the drawings, and may include just the constituent components corresponding to the intended use.

Applications

The light emitting device of the present disclosure is applicable to a projector. By the first laser elements 30a and the second laser elements 30b emitting laser light in the same color, the light emitting device emits single-color laser light. A projector that includes a light emitting device emitting red-color laser light, a light emitting device emitting green-color laser light, and a light emitting device emitting blue-color laser light can realize laser light in any color of visible light including white color.

Furthermore, the light emitting device of the present disclosure is also applicable to an illumination device. For example, the first laser elements 30a and the second laser elements 30b that include three types of laser elements respectively emitting red-color, green-color, and blue-color laser light allows one light emitting device to emit white-color laser light. Alternatively, by the three types of laser elements separately driven, one light emitting device emits laser light in any color of visible light including white color.

The compact and thin light emitting device including a plurality of laser elements emits high-luminance laser light. This can increase the output and luminance of a light source used as a projector, lighting device and the like. This can also reduce size and weight of a device such as a projector, lighting device and the like.

Use of the light emitting device of the present disclosure is not limited to a light source that emits visible light, but includes a ultraviolet or infrared radiation source.

In addition to the above-described projector or lighting device, the light emitting device of the present disclosure is applicable to, for example, an optical communication system, an optical device in a printing device or a measurement device.

What is claimed is:

1. A light emitting device comprising:
   a substrate including a main surface;
   a first projection positioned on the main surface, the first projection including an upper surface and first and second lateral surfaces meeting the upper surface, wherein the first lateral surface of the first projection comprises a first reflective part, and the second lateral surface of the first projection comprises a second reflective part;
   a first laser element positioned on the main surface at a first reflective part side with respect to the first projection, the first laser element being configured to irradiate first laser light to the first reflective part;
   a second laser element positioned on the main surface at a second reflective part side with respect to the first projection, the second laser element being configured to irradiate second laser light to the second reflective part; and
   a first optical member bonded to the upper surface of the first projection; wherein:
   the first laser light reflected by the first reflective part transmits through the first optical member; and
   the second laser light reflected by the second reflective part transmits through the first optical member.

2. The light emitting device according to claim 1, wherein:
   the first projection extends along the main surface;
   the first projection is elongated in a longitudinal direction of the upper surface;
   the first laser element and at least one additional first laser element are arranged in the longitudinal direction;

the second laser element and at least one additional second laser element are arranged in the longitudinal direction;

laser light emitted from the first laser element and laser light emitted from at least one additional first laser element are reflected by the first reflective part and transmit through the first optical member; and laser light emitted from the second laser element and laser light emitted from at least one additional second laser element are reflected by the second reflective part and transmit through the first optical member.

3. The light emitting device according to claim 1, wherein a center of gravity of the first optical member overlaps with the upper surface of the first projection as seen in a top view.

4. The light emitting device according to claim 1, further comprising:
a frame body including lateral surfaces that extend upward from the main surface; and
a cover covering the frame body at a position opposing the main surface; wherein:
the first optical member is positioned inward of the frame body between the main surface and the cover; and
laser light emitted from the first laser element and the second laser element transmits through the cover.

5. The light emitting device according to claim 1, further comprising:
a frame body including lateral surfaces that extend upward from the main surface;
a pair of first leads penetrating through the lateral surfaces of the frame body and configured to establish electrical connection of the first laser element; and
a pair of second leads penetrating through the lateral surfaces of the frame body and configured to establish electrical connection of the second laser element.

6. The light emitting device according to claim 1, wherein the first projection and the first optical member are bonded to each other with a bonding member containing metal.

7. The light emitting device according to claim 2, wherein:
a length of the upper surface of the first projection in the longitudinal direction is in a range of 3 mm to 20 mm inclusive; and
a width of the upper surface of the first projection is in a range of 2 mm to 10 mm inclusive.

8. The light emitting device according to claim 1, wherein a height of the first projection is 3 mm or less.

9. The light emitting device according to claim 2, wherein a center-to-center distance of any two adjacent ones of the first laser element and the at least one additional first laser element is 0.85 mm or more, and a center-to-center distance of any two adjacent ones of the second laser element and at least one additional second laser element is 0.85 mm or more.

10. The light emitting device according to claim 1, further comprising:
a second projection positioned on the main surface, the second projection including an upper surface and first and second lateral surfaces meeting the upper surface, wherein the first lateral surface of the second projection comprises a third reflective part, and the second lateral surface of the second projection comprises a fourth reflective part;
a third laser element positioned on the main surface at a third reflective part side with respect to the second projection and configured to irradiate third laser light to the third reflective part, wherein the third laser element is positioned between the first projection and the second projection;
a fourth laser element positioned on the main surface at a fourth reflective part side with respect to the second projection and configured to irradiate fourth laser light to the fourth reflective part; and
a second optical member bonded to the upper surface of the second projection; wherein:
the third laser light reflected by the third reflective part transmits through the second optical member; and
the fourth laser light reflected by the fourth reflective part transmits through the second optical member.

11. The light emitting device according to claim 10, wherein:
the second projection extends along the main surface;
the second projection is elongated in a longitudinal direction of the upper surface;
the third laser element and at least one additional third laser element are arranged in the longitudinal direction of the upper surface of the second projection;
the fourth laser element and at least one additional fourth laser element arranged in the longitudinal direction of the upper surface of the second projection;
laser light emitted from the third laser element and laser light emitted from at least one additional third laser element are reflected by the third reflective part and transmit through the second optical member; and
laser light emitted from the fourth laser element and laser light emitted from at least one additional fourth laser element are reflected by the fourth reflective part and transmit through the second optical member.

12. The light emitting device according to claim 5, further comprising:
a second projection positioned on the main surface, the second projection including an upper surface and first and second lateral surfaces meeting the upper surface, the first lateral surface of the second projection comprising a third reflective part, and the second lateral surface of the second projection comprising a fourth reflective part;
a third laser element positioned on the main surface at a third reflective part side with respect to the second projection and configured to irradiate third laser light to the third reflective part, wherein the third laser element is positioned between the first projection and the second projection
a fourth laser element positioned on the main surface at a fourth reflective part side with respect to the second projection and configured to irradiate fourth laser light to the fourth reflective part; and
a second optical member bonded to the upper surface of the second projection, wherein the third laser light reflected by the third reflective part transmits through the second optical member; and
a pair of third leads penetrating through the lateral surfaces of the frame body and configured to establish electrical connection of the fourth laser element; wherein:
the fourth laser light reflected by the fourth reflective part transmits through the second optical member; and
the pair of second leads penetrates through two opposing lateral surfaces among the lateral surfaces of the frame body on a second reflective part side with respect to the first projection and on a third reflective part side with respect to the second projection, and is configured to establish electrical connection of the second laser element and the third laser element.

13. A light emitting device comprising:
a substrate including a main surface;
a first projection positioned on the main surface, the first projection including an upper surface and first and second lateral surfaces meeting the upper surface, wherein the first lateral surface of the first projection comprises a first reflective part;
a second projection positioned on the main surface, the second projection including an upper surface and first and second lateral surfaces meeting the upper surface, wherein the first lateral surface of the second projection comprises a second reflective part;
at least one first laser element positioned on the main surface between the first projection and the second projection and configured to irradiate first laser light to the first reflective part;
at least one second laser element positioned on the main surface between the first projection and the second projection and configured to irradiate second laser light to the second reflective part; and
an optical member bonded to the upper surface of the first projection and the upper surface of the second projection; wherein:
the first projection and the second projection are positioned on the main surface so that the first reflective part and the second reflective part are opposed to each other;
the first laser light reflected by the first reflective part transmits through the optical member; and
the second laser light reflected by the second reflective part transmits through the optical member.

* * * * *